(12) United States Patent
Inoue et al.

(10) Patent No.: US 8,283,735 B2
(45) Date of Patent: Oct. 9, 2012

(54) PACKAGED DEVICE AND PRODUCING METHOD THEREOF

(75) Inventors: Hiroaki Inoue, Kawasaki (JP); Takashi Katsuki, Kawasaki (JP); Fumihiko Nakazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 233 days.

(21) Appl. No.: 12/688,302

(22) Filed: Jan. 15, 2010

(65) Prior Publication Data

US 2010/0218977 A1 Sep. 2, 2010

(30) Foreign Application Priority Data

Feb. 27, 2009 (JP) ................................. 2009-45873

(51) Int. Cl.
*H01L 29/84* (2006.01)
*H01L 23/04* (2006.01)
*H01L 21/00* (2006.01)

(52) U.S. Cl. ........................... 257/414; 257/730; 438/51
(58) Field of Classification Search .................. 257/730; 438/51
See application file for complete search history.

(56) References Cited

U.S. PATENT DOCUMENTS

| | | | |
|---|---|---|---|
| 6,391,673 B1 | 5/2002 | Ha et al. | |
| 7,271,426 B2 * | 9/2007 | Horio et al. | 257/99 |
| 2001/0021570 A1 | 9/2001 | Lin et al. | |
| 2004/0157407 A1 | 8/2004 | Tong et al. | |
| 2007/0040281 A1 | 2/2007 | Nakayama et al. | |
| 2007/0180916 A1 | 8/2007 | Tian et al. | |
| 2008/0205021 A1 | 8/2008 | Mizuno et al. | |

FOREIGN PATENT DOCUMENTS

| | | |
|---|---|---|
| DE | 103 24 421 A1 | 1/2005 |
| DE | 10-2007-007178 A1 | 8/2007 |
| EP | 2022594 A1 | 2/2009 |
| JP | 2001-196484 A | 7/2001 |
| JP | 2005-251898 A | 9/2005 |
| JP | 2007-201196 A | 8/2007 |
| JP | 2007-324195 A | 12/2007 |
| JP | 2008-207311 A | 9/2008 |

OTHER PUBLICATIONS

"Conceptual View of Bonding", Home Page of Advanced Industrial Science and Technology, Advanced Manufacturing Research Institute (http://unit.aist.go.jp/amri/group/nimt/ja/Home.htm).

"Vacuum Bonding Apparatus", home page of Advanced Industrial Science and Technology, Advanced Manufacturing Research Institute (http://unit.aist.go.jp/amri/group/nimt/ja/Home.htm).

"Wafer Bonding Machine", PDF image from https://mhi.co.jp/products/pdf/water_bonding_machine_01.pdf).

(Continued)

*Primary Examiner* — Lex Malsawma
(74) *Attorney, Agent, or Firm* — Westerman, Hattori, Daniels & Adrian, LLP

(57) ABSTRACT

A packaged device includes a device substrate and a packaging unit. The device substrate includes a first surface and a device formed in the device substrate. The packaging unit includes an insulating layer which faces the device substrate. The insulating layer includes a second surface bonded to the first surface. A metal concentration of at least part of a peripheral surface in the insulating layer is higher than a metal concentration of an end surface on the device substrate side in the insulating layer. An outline of the first surface is retreated inward from an outline of the second surface.

8 Claims, 36 Drawing Sheets

OTHER PUBLICATIONS

German Office Action mailed Jan. 26, 2012 in corresponding German Application No. 10-2010-001-824.4 w/Partial Translation.
"Conceptual View of Bonding", Home Page of Advanced Industrial Science and Technology, Advanced Manufacturing Research Institute (http://unit.asit.go.jp/amri/group/nimt/ja/Home.htm) (Jan. 21, 2009).
"Vacuum Bonding Apparatus", home page of Advanced Industrial Science and Technology, Advanced Manufacturing Research Institute (http://unit.aist.go.jp/amri/group/nimt/ja/Home.htm) (Jan. 21, 2009).
"Wafer Bonding Machine", PDF image from http://www.mhi.co.jp/en/news/story/1004081344.html (Apr. 8, 2010).

* cited by examiner

PACKAGED DEVICE AND PRODUCING METHOD THEREOF

CROSS-REFERENCE TO RELATED APPLICATIONS

This application is based upon and claims the benefit of priority of the prior Japanese Patent Application No. 2009-45873, filed on Feb. 27, 2009, the entire contents of which are incorporated herein by reference.

FIELD

The embodiment discussed herein is related to a packaged device and a producing method thereof.

BACKGROUND

Recently application of a device having a minute structure, which is formed by a micromachining technology, is developed in various technical fields. Examples of the device include micro movable devices, such as an angular velocity sensor, an acceleration sensor, and a micromirror element, which have minute movable units. For example, the angular velocity sensor and the acceleration sensor are applied to an image stabilizing function of a video camera or a camera-equipped mobile telephone, an automobile navigation system, an air-bag inflation timing system, an attitude control system such as of an automobile and a robot. For example, the micromirror element is used as an element that plays a light reflecting function in an optical disk technology or an optical communication technology.

Japanese Patent Application Laid-Open Nos. 2001-196484, 2005-251898, and 2008-207311 disclose a method in which, in a process for producing a device having a minute structure, packaging is performed at a wafer level in order to avoid adhesion of a foreign matter or dust to a device or damage of the device.

First a device wafer and a packaging wafer are prepared in order that the packaged device is produced while the wafer-level packaging is realized. The device wafer includes plural device forming partitions. The device is formed in each device forming partition. The packaging wafer is separated into plural packaging units. After various kinds of processing are performed to the device wafer and the packaging wafer, the device wafer and the packaging wafer are bonded. Before the bonding, the device is formed in each device forming partition of the device wafer. Before the bonding, on a surface of the packaging wafer, an insulating film is formed in a region to be bonded to the device wafer (this is because electric separation between the device and the packaging unit is achieved in the produced packaged device).

Japanese Patent Application Laid-Open Nos. 2007-201196 and 2007-324195 disclose a room-temperature bonding method as a bonding technique. In the room-temperature bonding method, a high-temperature process can be avoided in the bonding, and therefore a problem caused by the high-temperature process can be avoided.

However, conventionally, even if the device wafer and the packaging wafer are bonded by the room-temperature bonding method while the insulating film is interposed therebetween, the electric separation is insufficiently achieved between the device wafer and the packaging wafer, and sometimes the electric separation is insufficiently achieved between the device and the packaging unit base material in the obtained packaged device. When the electric separation is insufficiently achieved between the device and the packaging unit base material, frequently a desired characteristic is not obtained in the device.

SUMMARY

According to an aspect of the embodiment, a packaged device includes a device substrate and a packaging unit. The device substrate includes a first surface and a device formed in the device substrate. The packaging unit includes an insulating layer which faces the device substrate. The insulating layer includes a second surface bonded to the first surface. A metal concentration of at least part of a peripheral surface in the insulating layer is higher than a metal concentration of an end surface on the device substrate side in the insulating layer. An outline of the first surface is retreated inward from an outline of the second surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
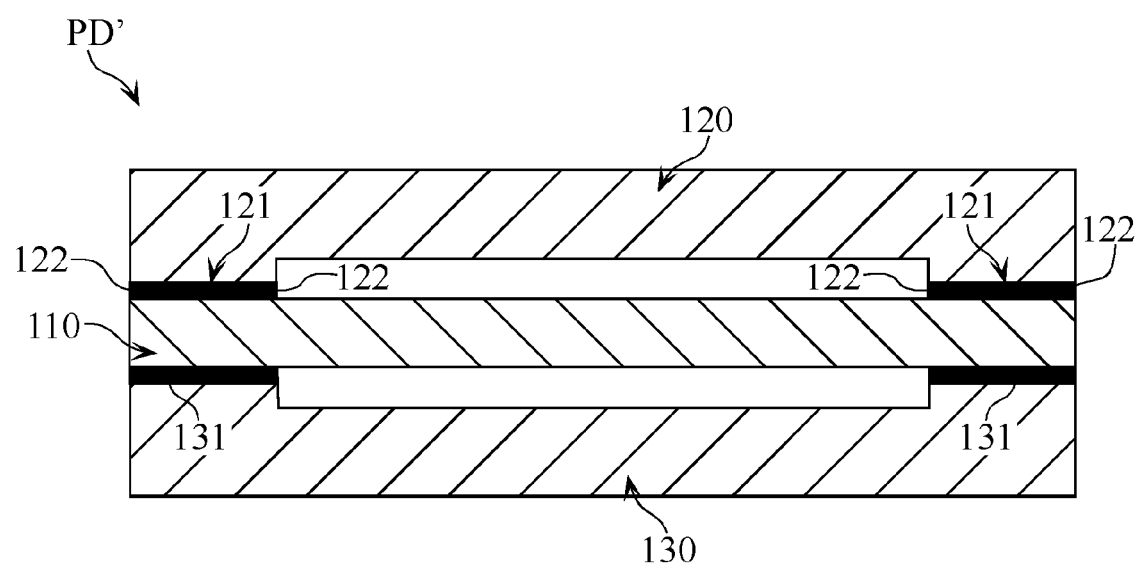
FIG. 1 is a sectional view illustrating an example of a conventional packaged device.

In a packaged device, for example, a first surface formed in a device substrate and a second surface formed in an insulating layer of a packaging unit are bonded by a room-temperature bonding method. The room-temperature bonding method means a technique of bonding two members with a high vacuum in a cleaned state in which surfaces to be bonded are irradiated with a predetermined beam to perform sputter etching. The cleaned state means one in which a dangling bond of constituent atoms is exposed to activate the surface.

In performing the room-temperature bonding method, the beam irradiation is performed in a high-vacuum chamber while a retaining mechanism retains bonding targets to cause the bonding targets to face each other. The beam irradiation causes the chamber and a metallic structure of the retaining mechanism to be subjected to sputter etching, thereby emitting metal (such as Fe, Al, and Cr) from the metallic structure. The minute amount of metal adheres to the surface of the member that is the bonding target, or the minute amount of metal is incorporated in the surface.

As a result of the search for the room-temperature bonding method, the inventors obtained knowledge that an amount of adhered and incorporated metal is uneven over the whole surface of the member. Specifically, while the relatively small amount of adhered and incorporated metal is even in the surfaces (including bonding target surface) facing each other in the members that are the bonding targets, many points having relatively large amount of adhered and incorporated metal exist in the surfaces that do not face each other. The reason why the relatively small amount of adhered and incorporated metal is even in the surfaces facing each other in the members that are the bonding targets is because an extent of the sputter etching is relatively strong in the surfaces during the beam irradiation.

In the packaged device, for example, the first surface formed in the device substrate and the second surface formed in the insulating layer of the packaging unit are bonded by the room-temperature bonding method. Therefore, a metal concentration in at least part of a peripheral surface of the insulating layer is higher than a metal concentration in an end surface on the device substrate side of the insulating layer. That is, an insulating property in at least part of the peripheral surface of the insulating layer of the packaging unit is lowered through a bonding process by the room-temperature bonding method. Further, in the packaged device, an outline of the first surface is retreated inward from the outline of the second surface. That is, the first surface formed in the device substrate does not come into contact with the peripheral surface of the insulating layer of the packaging unit. Therefore, in the packaged device, when a potential difference is generated between the device and the packaging unit base material, a leak current passed through the point where the insulating property of the peripheral surface of the insulating layer is lowered is hardly generated between the device and the base material of the packaging unit. Accordingly, electric separation between the device and the base material of the packaging unit is easily achieved in the packaged device.

FIG. 1 is a sectional view illustrating an example of a conventional packaged device PD'. The packaged device PD' includes a device substrate 110 and packaging units 120 and 130. A device to which a voltage is applied during operation is formed in the device substrate 110. An insulating film 121 is provided at a predetermined point of a base material surface of the packaging unit 120, and the packaging unit 120 is bonded to the device substrate 110 with the insulating film 121 interposed therebetween. The insulating film 121 is provided to achieve the electric separation between the device of the device substrate 110 and the base material of the packaging unit 120. An insulating film 131 is provided at a predetermined point of a base material surface of the packaging unit 130, and the packaging unit 130 is bonded to the device substrate 110 with the insulating film 131 interposed therebetween. The insulating film 131 is provided to achieve the electric separation between the device of the device substrate 110 and the base material of the packaging unit 130. The device formed in the device substrate 110 is sealed by a peripheral portion of the device substrate 110 and the packaging units 120 and 130.

Figure 2A:
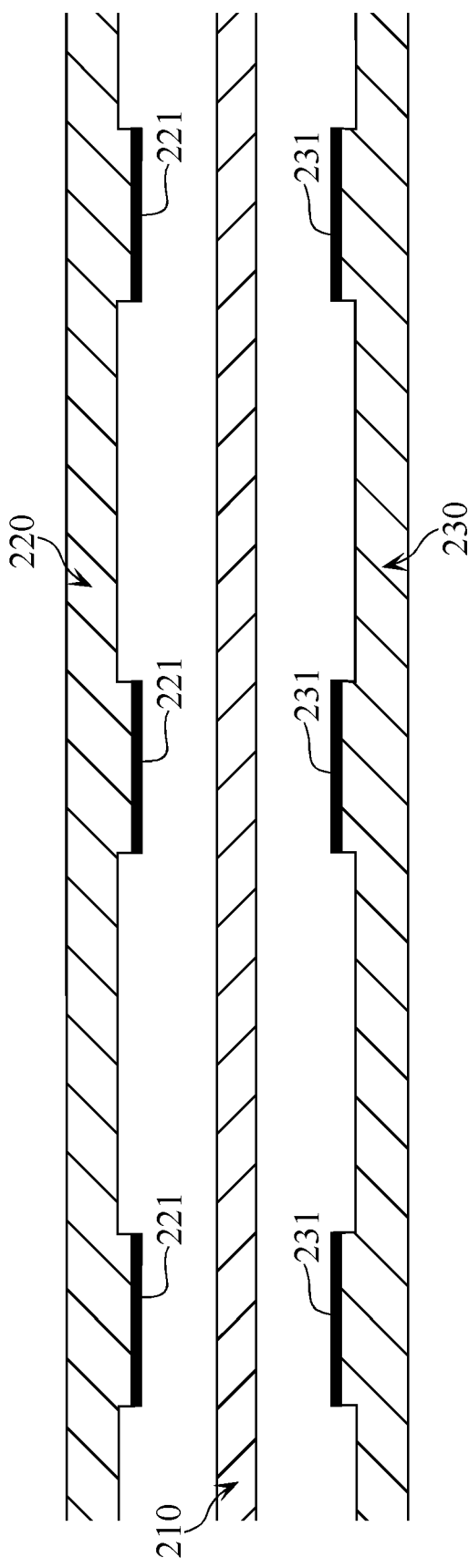
FIGS. 2A and 2B illustrate part of processes in a method for producing the packaged device of FIG. 1.

FIGS. 2A, 2B, 3A, and 3B illustrate a method for producing the packaged device PD'. In producing the packaged device PD', a device wafer 210 and packaging wafers 220 and 230 are prepared as illustrated in FIG. 2A. The device wafer 210 is a silicon wafer that includes plural device forming partitions in which the device is formed later. The packaging wafer 220 is a silicon wafer that includes plural packaging-unit forming partitions. In the packaging wafer 220, an insulating film 221 is patterned in a point where the packaging wafer 220 is bonded to the device wafer 210. The packaging wafer 230 is a silicon wafer that includes plural packaging-unit forming partitions. In the packaging wafer 230, an insulating film 231 is patterned in a point where the packaging wafer 230 is bonded to the device wafer 210.

Figure 2B:
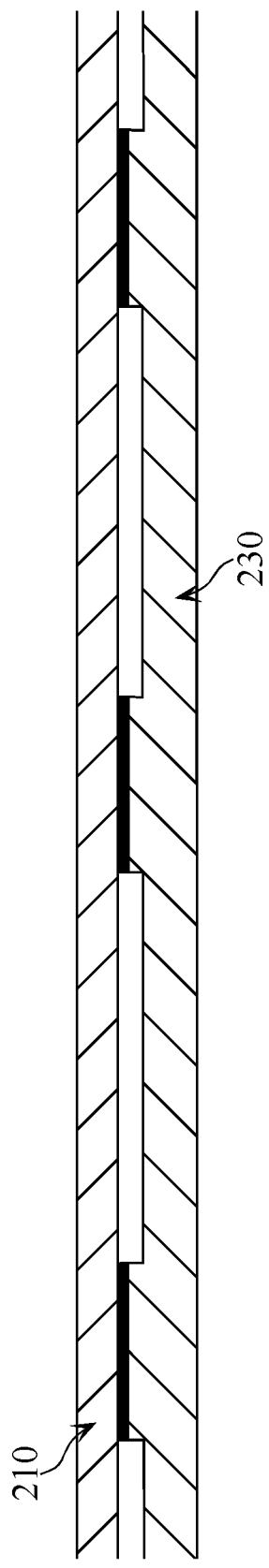

As illustrated in FIG. 2B, the device wafer 210 and the packaging wafer 230 are bonded to each other. For example, a direct bonding method or a plasma activated bonding method is adopted as the bonding technique.

Then processing is performed to the device wafer 210 that is hardly broken because of bonding of the device wafer 210 to the packaging wafer 230, thereby forming a device (not illustrated). Specifically, an anisotropic etching treatment is performed to the device wafer 210 from the opposite side of the packaging wafer 230 to form each structure of the device. Sometimes a predetermined metallic film is patterned as wiring in a surface of the device wafer 210 on the opposite side of the packaging wafer 230.

Figure 3A:
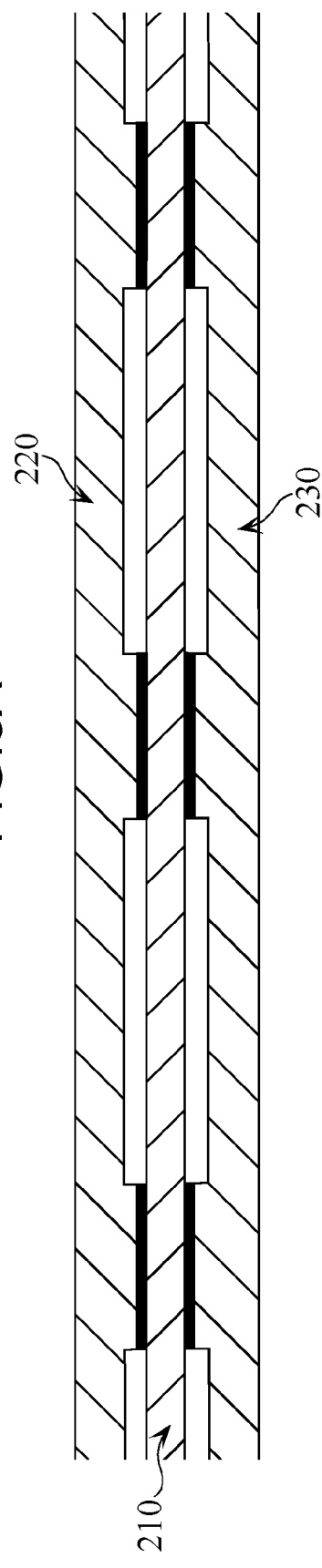
FIGS. 3A and 3B illustrate a process subsequent to the process of FIG. 2B.

As illustrated in FIG. 3A, the device wafer 210 and the packaging wafer 220 are bonded to each other. The room-temperature bonding method is adopted as the bonding technique. The room-temperature bonding method is the technique of bonding two members with a high vacuum in the cleaned state (the state in which the dangling bond of constituent atoms is exposed to activate the surface) in which the surfaces to be bonded are irradiated with a predetermined beam to perform sputter etching. In the room-temperature bonding method, the high-temperature process may be avoided in the bonding, and therefore the problems caused by the high-temperature process may be avoided. When the device wafer 210 is subjected to the high-temperature process after the device is formed, sometimes each structure of the device is deformed through thermal expansion. For the device including the metallic film as the wiring, when the device wafer 210 is subjected to the high-temperature process after the device is formed, sometimes the metallic film is deformed or peeled off through the thermal expansion. In order to avoid such problems, the room-temperature bonding method is adopted as the technique of bonding the device wafer 210 and the packaging wafer 220 after the formation of the device. Each device formed in the device wafer 210 is packaged at a wafer level through the room-temperature bonding process of FIG. 3A.

Figure 4:
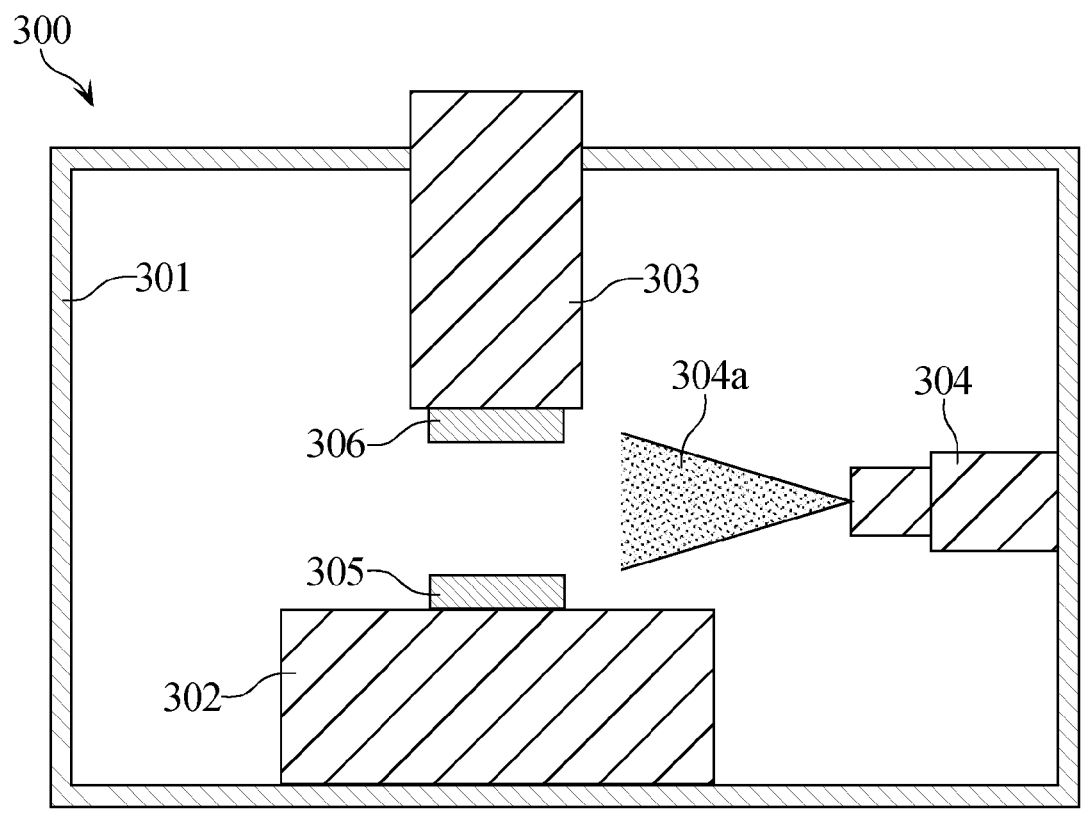
FIG. 4 illustrates a schematic configuration of a room-temperature bonding apparatus.

FIG. 4 illustrates a room-temperature bonding apparatus 300 that is an example of the room-temperature bonding apparatus for performing the room-temperature bonding process of FIG. 3A. The room-temperature bonding apparatus 300 includes a chamber 301, stages 302 and 303, and a gun 304. A vacuum pump (not illustrated) is connected to the chamber 301 to evacuate the chamber 301 into a high vacuum. For example, the chamber 301 is made of stainless steel. The stage 302 is a retaining mechanism that retains a bonding target 305. The stage 302 can horizontally translate the retained bonding target 305, and rotate the retained bonding target 305 about a vertical axis. The stage 303 is a retaining mechanism that retains another bonding target 306. The stage 303 can vertically translate the retained bonding target 306. The stages 302 and 303 include a stainless steel member and an aluminum member. The gun 304 irradiates bonding target surfaces of the bonding targets 305 and 306 with a beam 304*a* in order to activate the bonding target surfaces. For example, the gun 304 is an FAB (Fast Atomic Beam) gun that irradiates bonding target surfaces with an Ar atom beam or an ion gun that irradiates bonding target surfaces with an Ar ion beam.

For example, in order to perform the room-temperature bonding process of FIG. 3A with the room-temperature bonding apparatus 300, a laminated structure of the device wafer 210 and the packaging wafer 230 is retained as the bonding target 305 by the stage 302. The packaging wafer 220 is retained as the bonding target 306 by the stage 303. The vacuum pump is operated to evacuate the chamber 301 into a high vacuum. The stages 302 and 303 are operated to cause the bonding target surfaces of the bonding targets 305 and 306 to face each other. The gun 304 irradiates bonding target surfaces of the bonding targets 305 and 306 with the beam 304*a* to activate the bonding target surfaces. Irradiation intensity, an irradiation time, and an irradiation direction of the beam 304*a* are set such that the bonding target surfaces of the bonding targets 305 and 306 are efficiently activated. The stage 303 is operated to lower the bonding target 306, and the bonding target surfaces of the bonding targets 305 and 306 are brought into contact with each other. Therefore, the bonding targets 305 and 306 are strongly bonded.

Figure 3B:
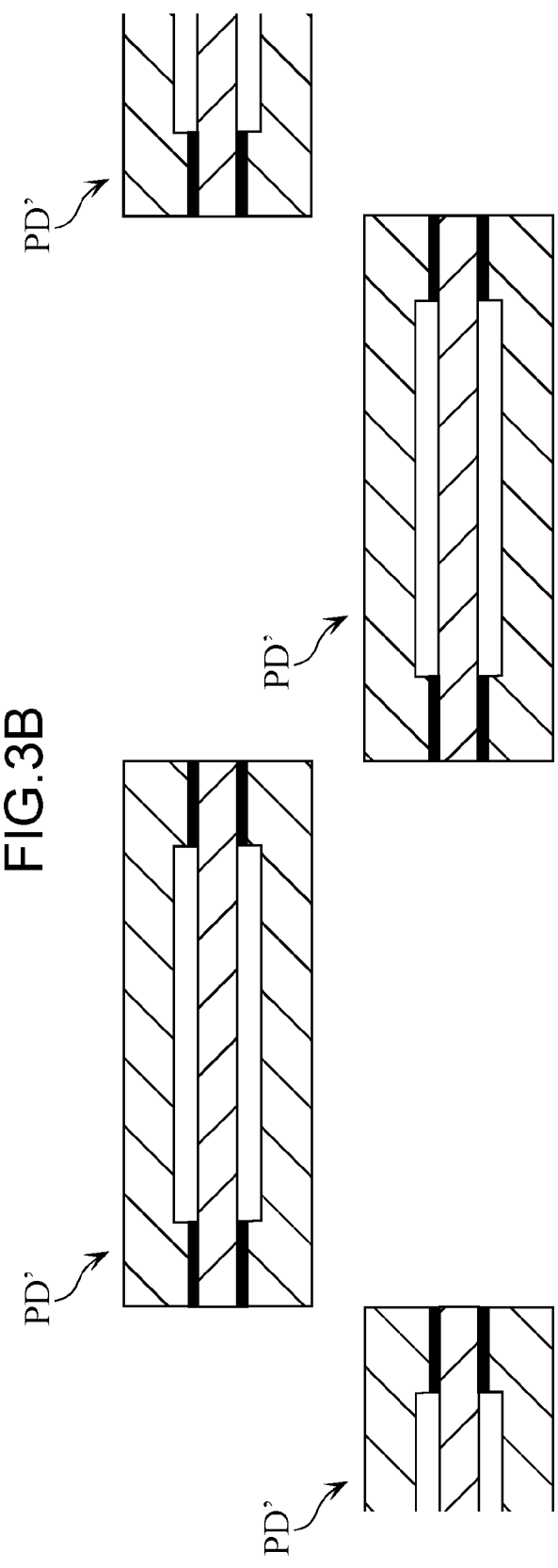

In producing the packaged device PD', a dicing process is performed as illustrated in FIG. 3B. The laminated structure including the device wafer 210 and the packaging wafers 220 and 230 is individually separated in the dicing process, thereby obtaining the packaged device PD'.

In the packaged device PD', although the insulating film 121 is interposed between the device substrate 110 or the device and the base material of the packaging unit 120, the device and the base material are electrically insufficiently separated from each other. This is attributed to the following reason.

Referring to FIGS. 3A and 4, in the room-temperature bonding process, the beam irradiation is performed in the high-vacuum chamber 301 while the stages 302 and 303 retain the bonding targets 305 and 306 to cause the bonding targets 305 and 306 to face each other. The beam irradiation causes the chamber 301 and the metallic structures of the stages 302 and 303 to be subjected to sputter etching, thereby emitting metal (such as Fe, Al, and Cr) from the metallic structures. The minute amount of metal adheres to or is incorporated into the surface of the bonding targets 305 and 306. However, the amount of adhered and incorporated metal is uneven in the surfaces of the bonding targets 305 and 306. Specifically, while the relatively small amount of adhered and incorporated metal is even in the surfaces (including bonding target surface) facing each other in the bonding targets 305 and 306, many points having relatively large amount of adhered and incorporated metal exist in other surfaces of the bonding targets 305 and 306. The reason why the relatively small amount of adhered and incorporated metal is even in the surfaces facing each other in the bonding targets 305 and 306 is because an extent of the sputter etching is relatively strong in the surfaces during the beam irradiation.

Figure 5:
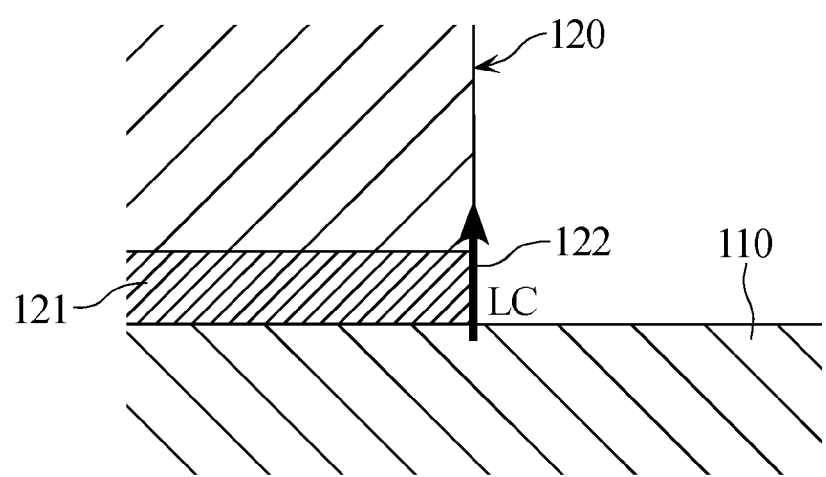
FIG. 5 is a partially enlarged view of FIG. 1.

Due to the characteristic of the room-temperature bonding method, a point where the metal concentration is relatively high is easily generated in the peripheral surface 122 (the surface that does not face the side of the device wafer 210 in the room-temperature bonding process) of the insulating film 121 of the packaging unit 120 in the packaged device PD'. For example, the metal concentration ranges from 20 to 25 at %. In the peripheral surface 122 of the insulating film 121, the insulating property is lowered in the point (part or whole of peripheral surface 122) where the metal concentration is relatively high. Therefore, in the packaged device PD', when the potential difference is generated between the device of the device substrate 110 and the base material of the packaging unit 120, a leak current LC of FIG. 5 passed through the point where the insulating property of the peripheral surface 122 of the insulating film 121 is lowered is easily generated between the device and the base material of the packaging unit 120. Accordingly, in the packaged device PD', the device and the base material of the packaging unit 120 are electrically insufficiently separated from each other.

Figure 6:
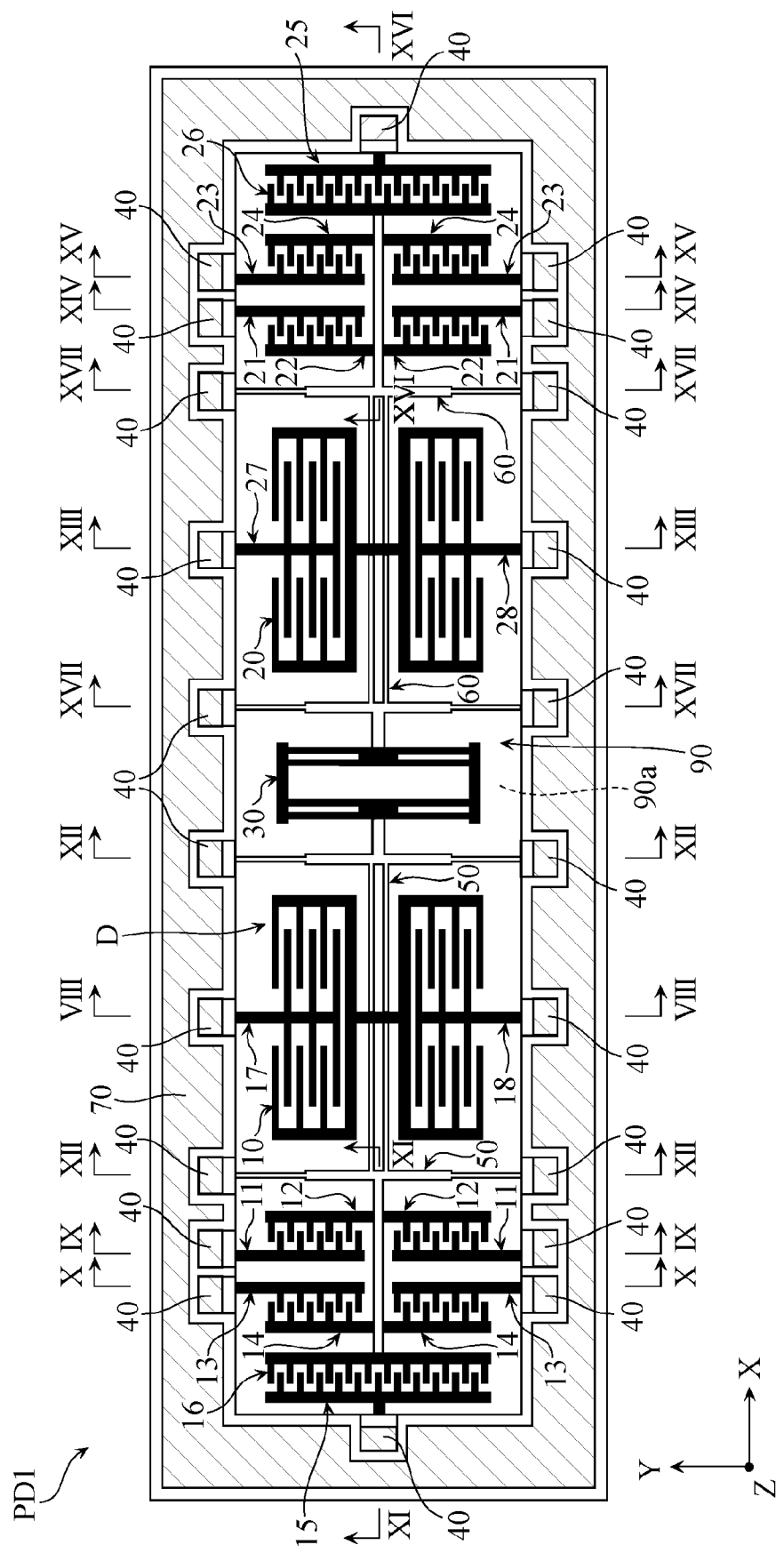
FIG. 6 is a plan view illustrating a packaged device according to a first embodiment with a portion of the packaged device omitted.
Figure 7:
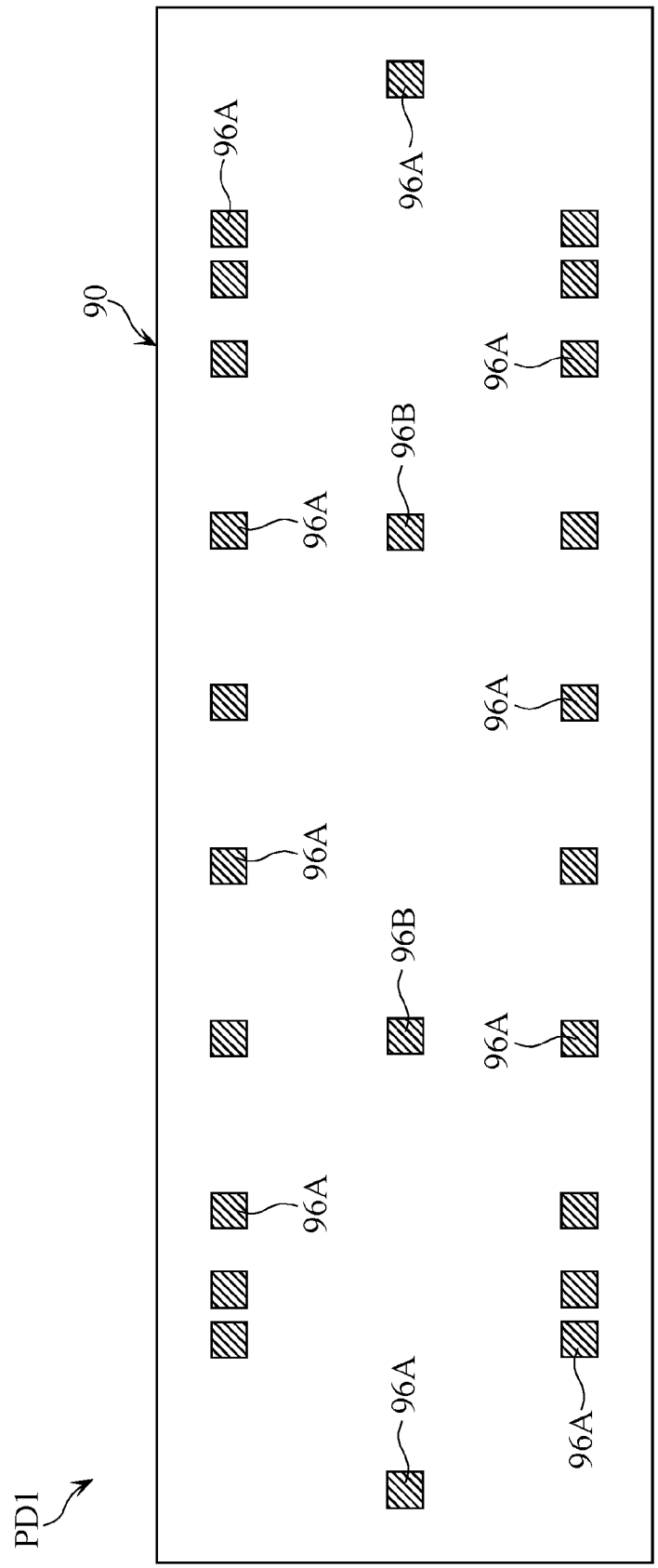
FIG. 7 is another plan view illustrating the packaged device of the first embodiment.

FIGS. 6 to 17 illustrate a packaged device PD1 according to a first embodiment. FIG. 6 is a plan view illustrating the packaged device PD1 with a portion of the packaged device omitted. FIG. 7 is another plan view of the packaged device PD1. FIGS. 8 to 17 are enlarged sectional views taken on a line VIII-VIII, a line IX-IX, line X-X, a line XI-XI, a line XII-XII, a line XIII-XIII, a line XIV-XIV, a line XV-XV, a line XVI-XVI, and a line XVII-XVII, respectively, of FIG. 6.

The packaged device PD1 includes a device D, an external wall portion 70, a packaging unit 80, and a packaging unit 90. In FIG. 6, the packaging unit 80 is omitted. FIG. 7 is a plan view on the side of the packaging unit 90 of the packaged device PD1.

As illustrated in FIG. 6, the device D is an angular velocity sensor, and includes vibration units 10 and 20, a coupling beam unit 30, an anchor unit 40, and connecting units 50 and 60. The device D also includes drive electrodes 11, 12, 13, 14, 21, 22, 23, and 24, monitor electrodes 15, 16, 25, and 26, and detection electrodes 17, 18, 27, and 28. On the other hand, the external wall portion 70 has a shape surrounding the device D, and is interposed between the packaging units 80 and 90 as illustrated in FIGS. 8 to 17. The device D and the external wall portion 70 constitute the device substrate. The device substrate (device D and external wall portion 70) is prepared by processing a silicon wafer by a bulk micromachining technology such as a MEMS (Micro-Electromechanical Systems) technology. A conductive property is imparted to the silicon wafer by doping an impurity. For the sake of convenience, the surfaces (bonding target surfaces S1 and S1') of the device substrate, which are bonded to the packaging unit 80, are illustrated by hatching in FIG. 6. For the sake of convenience, except for the connecting units 50 and 60 in the device substrate, a member having a gap between the packaging units 80 and 90 is illustrated by solid black.

The vibration unit 10 has part of an interdigitated electrode structure including plural electrode teeth. The vibration unit 10 can be vibrated in an X-axis direction of FIG. 6, and can be vibrated in a Y-axis direction of FIGS. 6 and 8. The vibration unit 20 has part of an interdigitated electrode structure including plural electrode teeth. The vibration unit 20 can be vibrated in the X-axis direction of FIG. 6, and can be vibrated in the Y-axis direction of FIGS. 6 and 13. The vibration units 10 and 20 are disposed in the X-axis direction while separated from each other. The X-axis direction and the Y-axis direction are orthogonal to each other.

Figure 9:
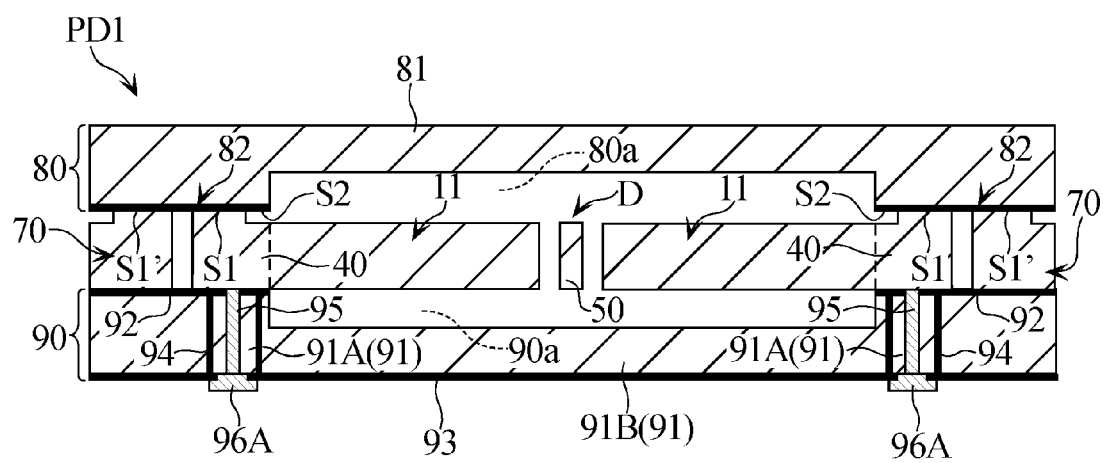
FIG. 9 is an enlarged sectional view taken on a line IX-IX of FIG. 6.

The drive electrode 11 is extended from one anchor unit 40, and has an interdigitated electrode structure including plural electrode teeth. As illustrated in FIG. 9, the anchor unit 40 from which the drive electrode 11 is extended is fixed between the packaging units 80 and 90. The drive electrode 11 is a fixed drive electrode. The drive electrode 12 is extended from the connecting unit 50, and has an interdigitated electrode structure including plural electrode teeth. The drive electrode 12 is a movable drive electrode. The drive electrodes 11 and 12 constitute one drive unit that generates a drive force (electrostatic attractive force) in order to perform reference vibration of the vibration unit 10 in the X-axis direction.

Figure 10:
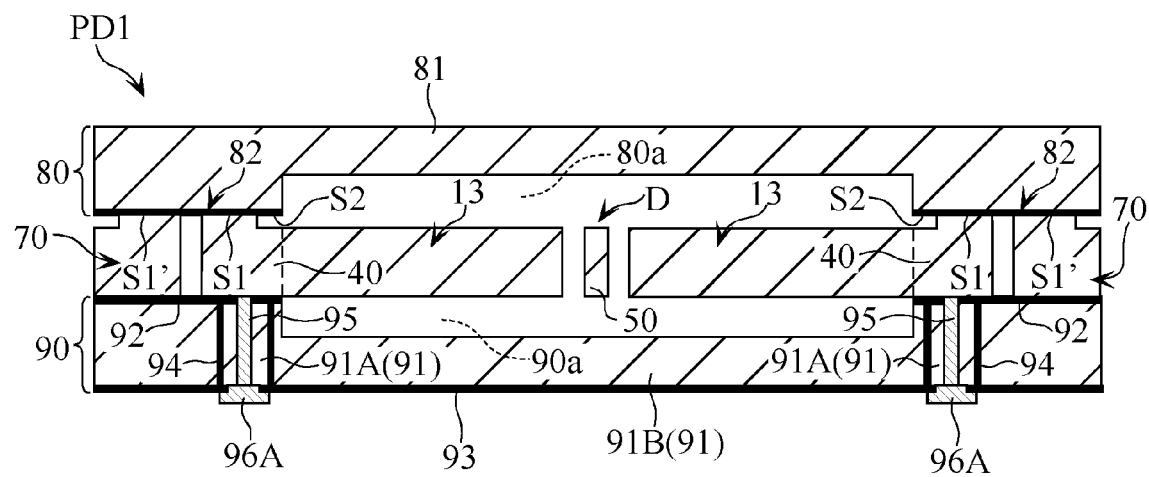
FIG. 10 is an enlarged sectional view taken on a line X-X of FIG. 6.

The drive electrode 13 is extended from one anchor unit 40, and has an interdigitated electrode structure including plural electrode teeth. As illustrated in FIG. 10, the anchor unit 40 from which the drive electrode 13 is extended is fixed between the packaging units 80 and 90. The drive electrode 13 is the fixed drive electrode. The drive electrode 14 is extended from the connecting unit 50, and has an interdigitated electrode structure including plural electrode teeth. The drive electrode 14 is the movable drive electrode. The drive electrodes 13 and 14 constitute one drive unit that generates the drive force (electrostatic attractive force) in order to perform the reference vibration of the vibration unit 10 in the X-axis direction.

Figure 11:
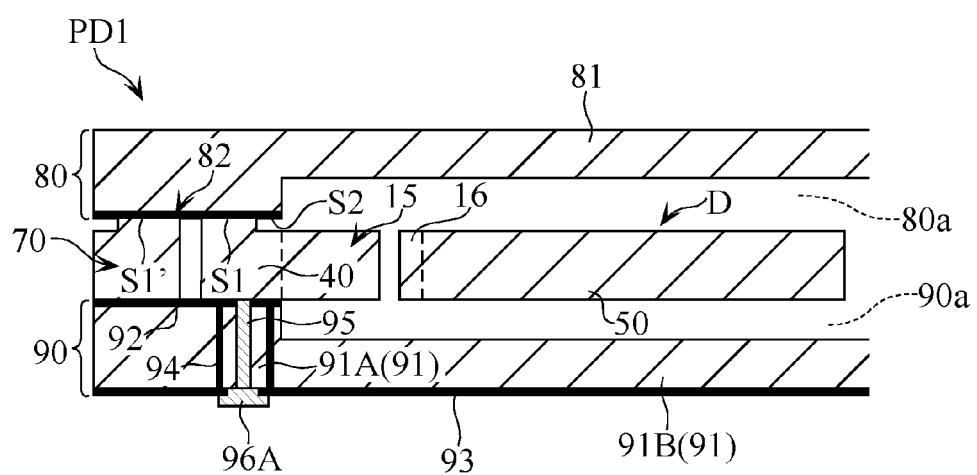
FIG. 11 is an enlarged sectional view taken on a line XI-XI of FIG. 6.
Figure 12:
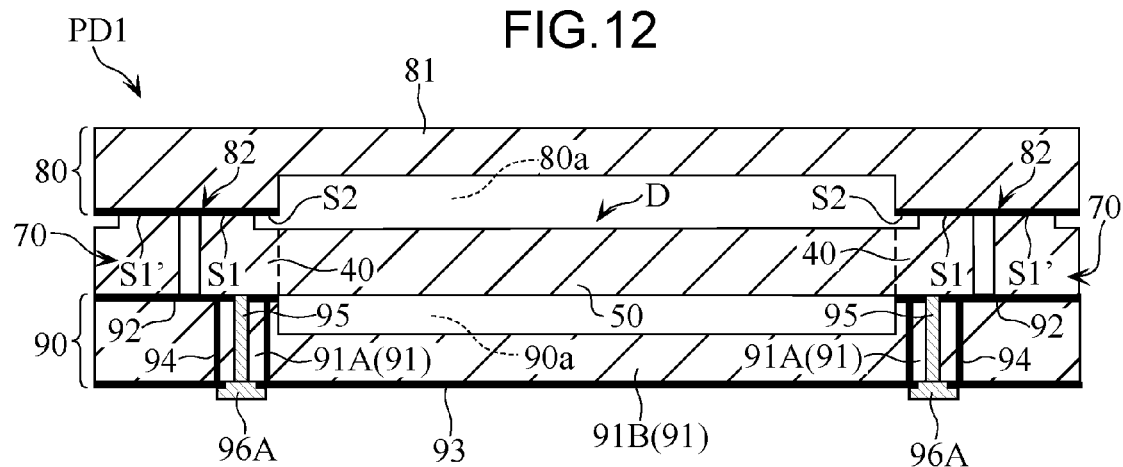
FIG. 12 is an enlarged sectional view taken on a line XII-XII of FIG. 6.

The monitor electrode 15 is extended from one anchor unit 40, and has an interdigitated electrode structure including plural electrode teeth. As illustrated in FIG. 11, the anchor unit 40 from which the monitor electrode 15 is extended is fixed between the packaging units 80 and 90. The monitor electrode 15 is a fixed monitor electrode. The monitor electrode 16 is extended from the connecting unit 50, and has an interdigitated electrode structure including plural electrode teeth. The monitor electrode 16 is a movable monitor electrode. The monitor electrodes 15 and 16 constitute a detection unit that detects a displacement amount of the vibration unit 10 in the X-axis direction from a change in electrostatic capacitance.

Figure 8:
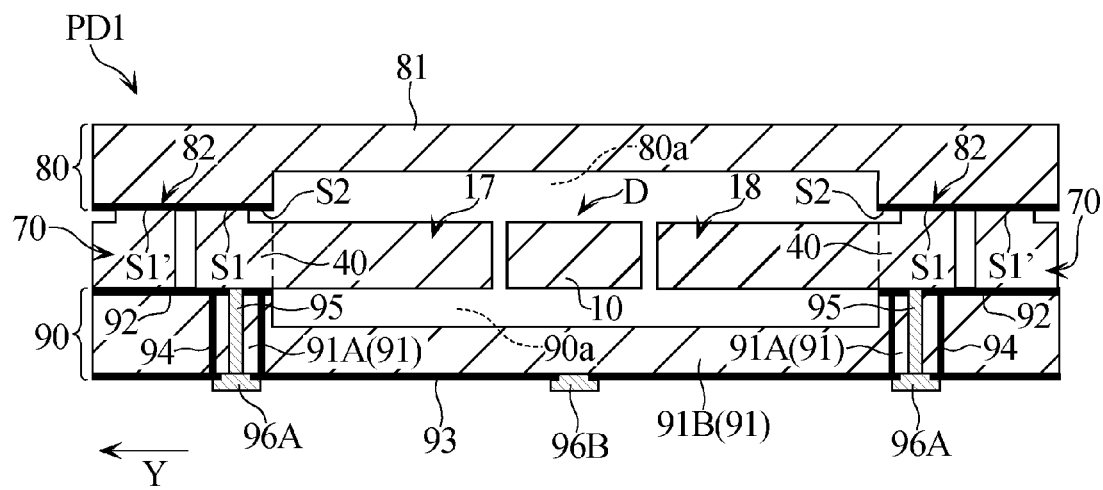
FIG. 8 is an enlarged sectional view taken on a line VIII-VIII of FIG. 6.

The detection electrode 17 is extended from one anchor unit 40, and has an interdigitated electrode structure including plural electrode teeth. As illustrated in FIG. 8, the anchor unit 40 from which the detection electrode 17 is extended is fixed between the packaging units 80 and 90. The detection electrode 18 is extended from one anchor unit 40, and has an interdigitated electrode structure including plural electrode teeth. The anchor unit 40 from which the detection electrode 18 is extended is fixed between the packaging units 80 and 90. The detection electrodes 17 and 18 constitute a detection unit that detects a displacement amount of the vibration unit 10 in the Y-axis direction from the change in electrostatic capacitance with the interdigitated electrode structure portion of the vibration unit 10.

Figure 14:
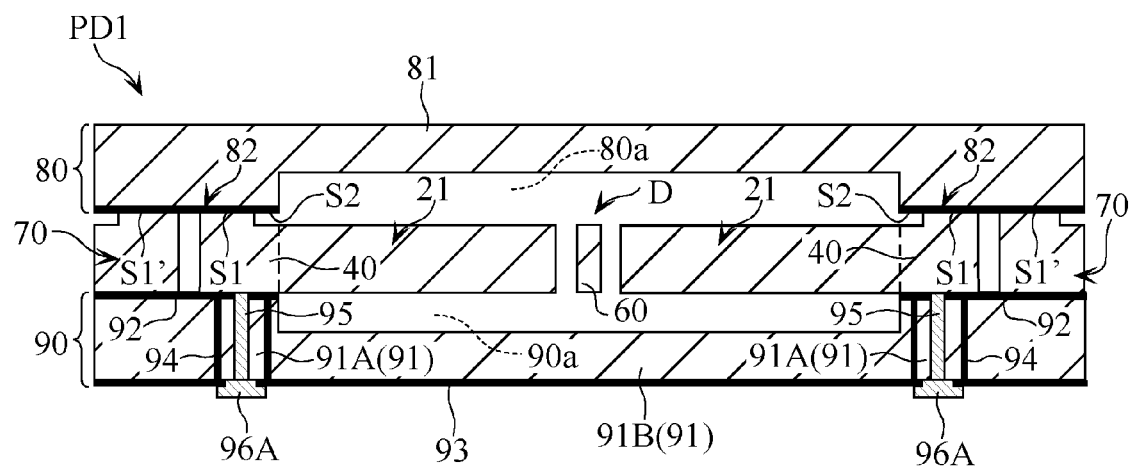
FIG. 14 is an enlarged sectional view taken on a line XIV-XIV of FIG. 6.

The drive electrode 21 is extended from one anchor unit 40, and has an interdigitated electrode structure including plural electrode teeth. As illustrated in FIG. 14, the anchor unit 40 from which the drive electrode 21 is extended is fixed between the packaging units 80 and 90. The drive electrode 21 is the fixed drive electrode. The drive electrode 22 is extended from the connecting unit 60, and has an interdigitated electrode structure including plural electrode teeth. The drive electrode 22 is the movable drive electrode. The drive electrodes 21 and 22 constitute one drive unit that generates the drive force (electrostatic attractive force) in order to perform reference vibration of the vibration unit 20 in the X-axis direction.

Figure 15:
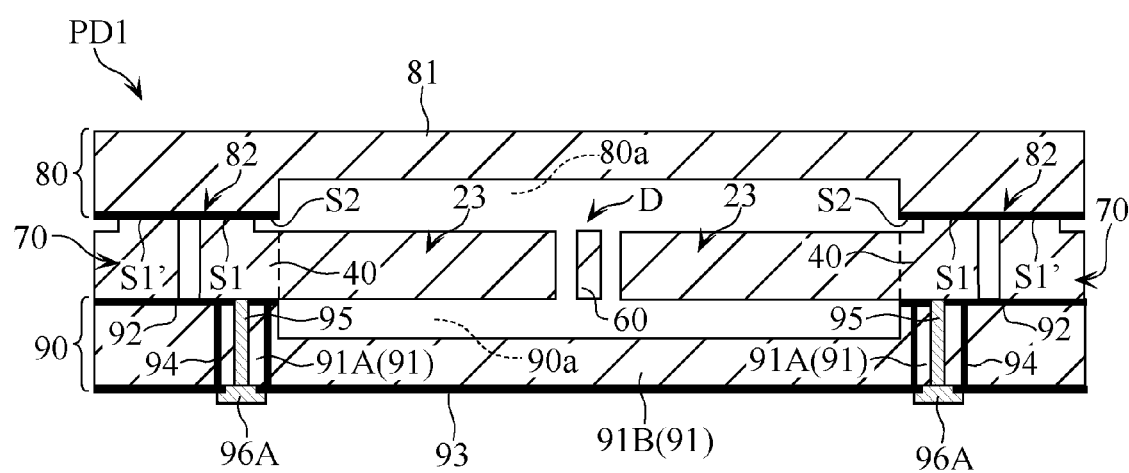
FIG. 15 is an enlarged sectional view taken on a line XV-XV of FIG. 6.

The drive electrode 23 is extended from one anchor unit 40, and has an interdigitated electrode structure including plural electrode teeth. As illustrated in FIG. 15, the anchor unit 40 from which the drive electrode 23 is extended is fixed between the packaging units 80 and 90. The drive electrode 23 is the fixed drive electrode. The drive electrode 24 is extended from the connecting unit 60, and has an interdigitated electrode structure including plural electrode teeth. The drive electrode 24 is the movable drive electrode. The drive electrodes 23 and 24 constitute one drive unit that generates the drive force (electrostatic attractive force) in order to perform the reference vibration of the vibration unit 20 in the X-axis direction.

Figure 16:
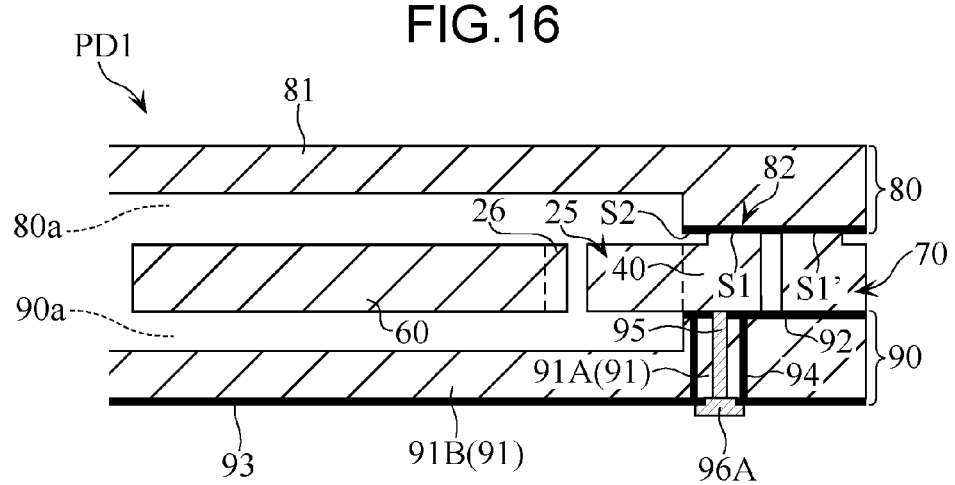
FIG. 16 is an enlarged sectional view taken on a line XVI-XVI of FIG. 6.
Figure 17:
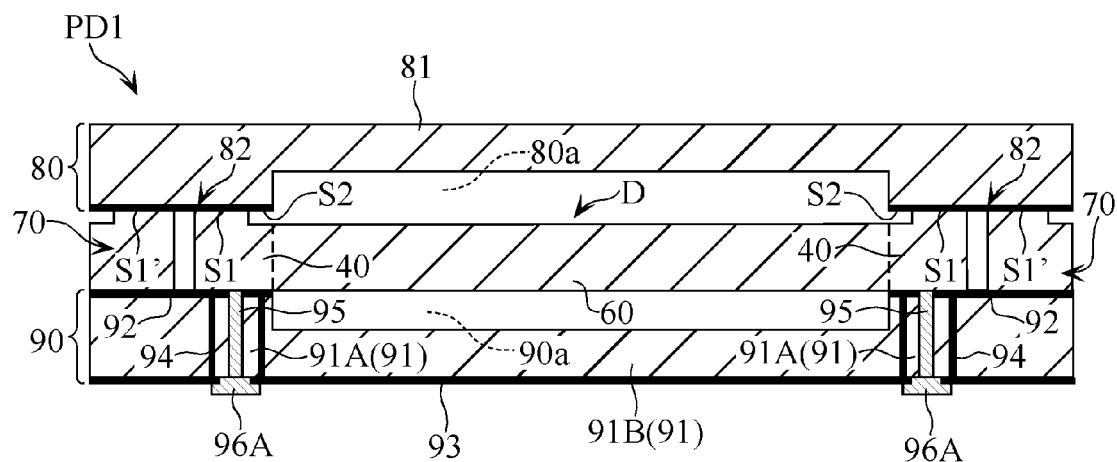
FIG. 17 is an enlarged sectional view taken on a line XVII-XVII of FIG. 6.

The monitor electrode 25 is extended from one anchor unit 40, and has an interdigitated electrode structure including plural electrode teeth. As illustrated in FIG. 16, the anchor unit 40 from which the monitor electrode 25 is extended is fixed between the packaging units 80 and 90. The monitor electrode 25 is the fixed monitor electrode. The monitor electrode 26 is extended from the connecting unit 60, and has an interdigitated electrode structure including plural electrode teeth. The monitor electrode 26 is the movable monitor electrode. The monitor electrodes 25 and 26 constitute a detection unit that detects a displacement amount of the vibration unit 20 in the X-axis direction from the change in electrostatic capacitance.

Figure 13:
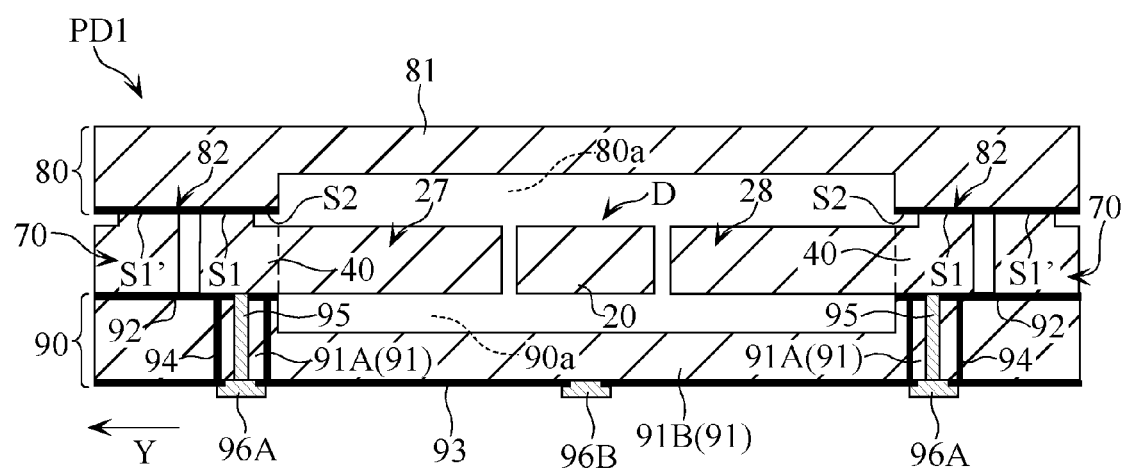
FIG. 13 is an enlarged sectional view taken on a line XIII-XIII of FIG. 6.

The detection electrode 27 is extended from one anchor unit 40, and has an interdigitated electrode structure including plural electrode teeth. As illustrated in FIG. 13, the anchor unit 40 from which the detection electrode 27 is extended is fixed between the packaging units 80 and 90. The detection electrode 28 is extended from one anchor unit 40, and has an interdigitated electrode structure including plural electrode teeth. The anchor unit 40 from which the detection electrode 28 is extended is fixed between the packaging units 80 and 90. The detection electrodes 27 and 28 constitute a detection unit that detects a displacement amount of the vibration unit 20 in the Y-axis direction from the change in electrostatic capacitance with the interdigitated electrode structure portion of the vibration unit 20.

The coupling beam unit 30 couples the reference vibrations in the X-axis direction of the vibration units 10 and 20 such that the reference vibrations become opposite phases.

As described above, each anchor unit 40 is fixed between the packaging units 80 and 90. FIGS. 8 to 17 illustrate the anchor unit 40 interposed between the packaging units 80 and 90. Each anchor unit 40 is bonded to the packaging units 80 and 90, and includes a bonding target surface S1 bonded to the packaging unit 80.

The connecting unit 50 forms a bridge among the vibration unit 10, the drive electrodes 12 and 14, the monitor electrode 16, the coupling beam unit 30, and the predetermined anchor unit 40. The connecting unit 50 transmits the drive forces generated by the drive electrodes 11 to 14 to the vibration unit 10 and the coupling beam unit 30 while supporting the vibration unit 10.

The connecting unit 60 forms a bridge among the vibration unit 20, the drive electrodes 22 and 24, the monitor electrode 26, the coupling beam unit 30, and the predetermined anchor unit 40. The connecting unit 60 transmits the drive forces generated by the drive electrodes 21 to 24 to the vibration unit 20 and the coupling beam unit 30 while supporting the vibration unit 20.

The external wall portion 70 has a shape surrounding the device D as illustrated in FIG. 6, and is interposed between the packaging units 80 and 90 as illustrated in FIGS. 8 to 17. The external wall portion 70 is bonded to the packaging units 80 and 90, and includes a bonding target surface S1' bonded to the packaging unit 80.

The vibration units 10 and 20, the drive electrodes 12, 14, 22, and 24, the monitor electrodes 16 and 26, the coupling beam unit 30, and the connecting units 50 and 60 constitute a movable unit of the device D. The drive electrodes 11, 13, 21, and 23, the monitor electrodes 15 and 25, the detection electrodes 17, 18, 27, and 28, and the anchor unit 40 constitute a fixed unit of the device D. Each anchor unit 40 constitutes an externally connecting terminal portion of the device D.

Figure 18:
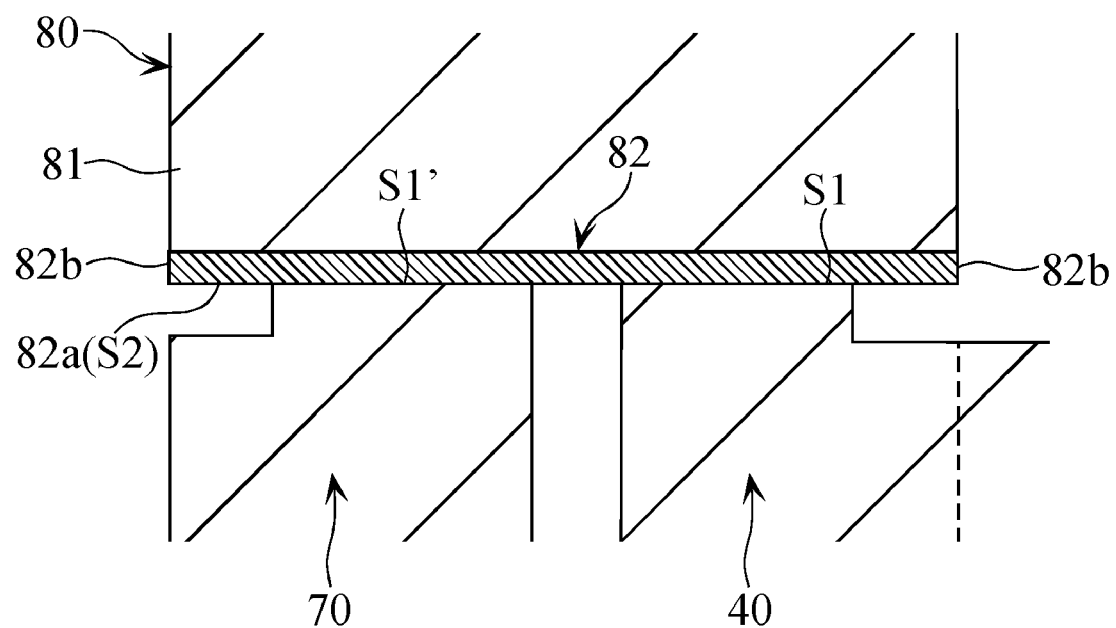
FIG. 18 is a partially enlarged view of FIG. 17.

As illustrated in FIGS. 8 to 17, the packaging unit 80 includes a base material 81, an insulating layer 82, and a recess 80a that is located in a point corresponding to the movable unit of the device D. The base material 81 is made of a silicon material. For example, the insulating layer 82 is made of oxide silicon. The packaging unit 80 is bonded to the anchor unit 40 and external wall portion 70 of the device D with the insulating layer 82 interposed therebetween. Specifically, the insulating layer 82 constitutes a bonding target surface S2 of the packaging unit 80, the bonding target surface S1 of each anchor unit 40 on the device substrate side, and the bonding target surface S1' of the external wall portion 70 are bonded to each other by the room-temperature bonding method. The insulating layer 82 constituting the bonding target surface S2 of the packaging unit 80 is used to achieve the electric separation between the device substrate or device D and the base material 81 of the packaging unit 80. Preferably the insulating layer 82 has a thickness of 50 nm or more. For example, as illustrated in FIG. 18, the insulating layer 82 includes an end surface 82a that is located on the device substrate side and a peripheral surface 82b that forms an outline of the bonding target surface S2. A metal concentration of at least part of the peripheral surface 82b is higher than a metal concentration of the end surface 82a. An outline of the bonding target surface S1 of each anchor unit 40 in the device substrate is retreated inward from an outline of the bonding target surface S2 of the packaging unit 80. Preferably a length by which the outline of the bonding target surface S1 is retreated inward from the outline of the bonding target surface S2 is 10 μm or more. Further, an outline of the bonding target surface S1' of the external wall portion 70 in the device substrate is retreated inward from the outline of the bonding target surface S2 of the packaging unit 80. Preferably a length by which the outline of the bonding target surface S1' is retreated inward from the outline of the bonding target surface S2 is 10 μm or more.

As illustrated in FIGS. 8 to 17, the packaging unit 90 includes a base material 91, insulating layers 92 and 93, an insulating wall 94, a conductive plug 95, electrode pads 96A and 96B, and a recess 90a. The base material 91 includes a wiring region 91A and a non-wiring region 91B. The recess 90a is located in a point corresponding to the movable unit of the device D. The base material 91 is made of a silicon material to which the conductive property is imparted by doing an impurity. For example, the insulating layers 92 and 93 and insulating wall 94 are made of oxide silicon. The conductive plug 95 and electrode pads 96A and 96B are made of a conductive material. The packaging unit 90 is bonded to the anchor unit 40 and external wall portion 70 of the device D with the insulating layer 92 interposed therebetween.

The wiring region 91A of the packaging unit 90 is provided in a position corresponding to each anchor unit 40, and has a cylindrical shape in the first embodiment. The insulating layer 92 is used to achieve the electric separation between the non-wiring region 91B of the packaging unit 90 and the device substrate. The insulating layer 93 of the packaging unit 90 is provided on the opposite side of the insulating layer 92. The insulating layer 93 includes a first opening that is located in a position corresponding to the wiring region 91A and a second opening that is located in a position corresponding to the non-wiring region 91B. The insulating wall 94 is an insulating portion that surrounds the wiring region 91A to electrically separate the wiring region 91A and the non-wiring region 91B. The conductive plug 95 pierces through the wiring region 91A and insulating layer 92 in a thickness direction of the packaging unit 90, and is bonded to one of the anchor units 40 of the device D. The electrode pad 96A is provided in the first opening of the insulating layer 93 while bonded to the wiring region 91A and the conductive plug 95. Each electrode pad 96A is electrically connected to one anchor unit 40 of the device D while the wiring region 91A and the conductive plug 95 are interposed therebetween. Each electrode pad 96B is provided in the second opening of the insulating layer 93 while bonded to the non-wiring region 91B. The electrode pads 96A and 96B constitute an externally connecting terminal portion of the packaged device PD1.

The device D is sealed by the packaging units 80 and 90 and the external wall portion 70. The packaged device PD1 is vacuum-sealed.

The packaged device PD1 may electrically be connected to an external circuit. Specifically, for example, each terminal portion (electrode pads 96A and 96B) provided in the packaging unit 90 and a predetermined terminal portion of the external circuit provided on a wiring board may mechanically and electrically be connected through a bump.

Figure 19:
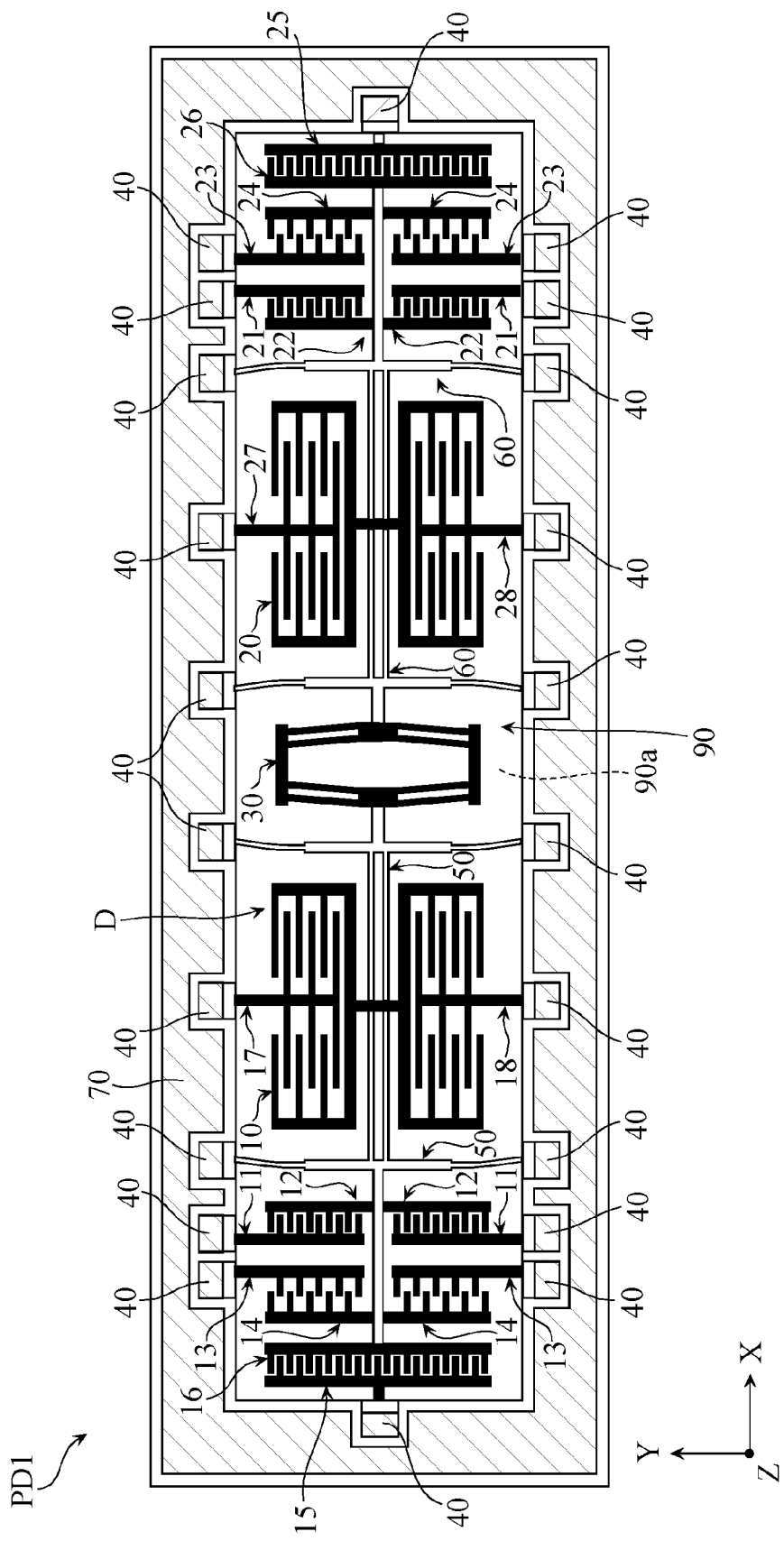
FIG. 19 is a plan view illustrating the packaged device of FIG. 6 with a portion of the packaged device omitted when the packaged device is driven.
Figure 20:
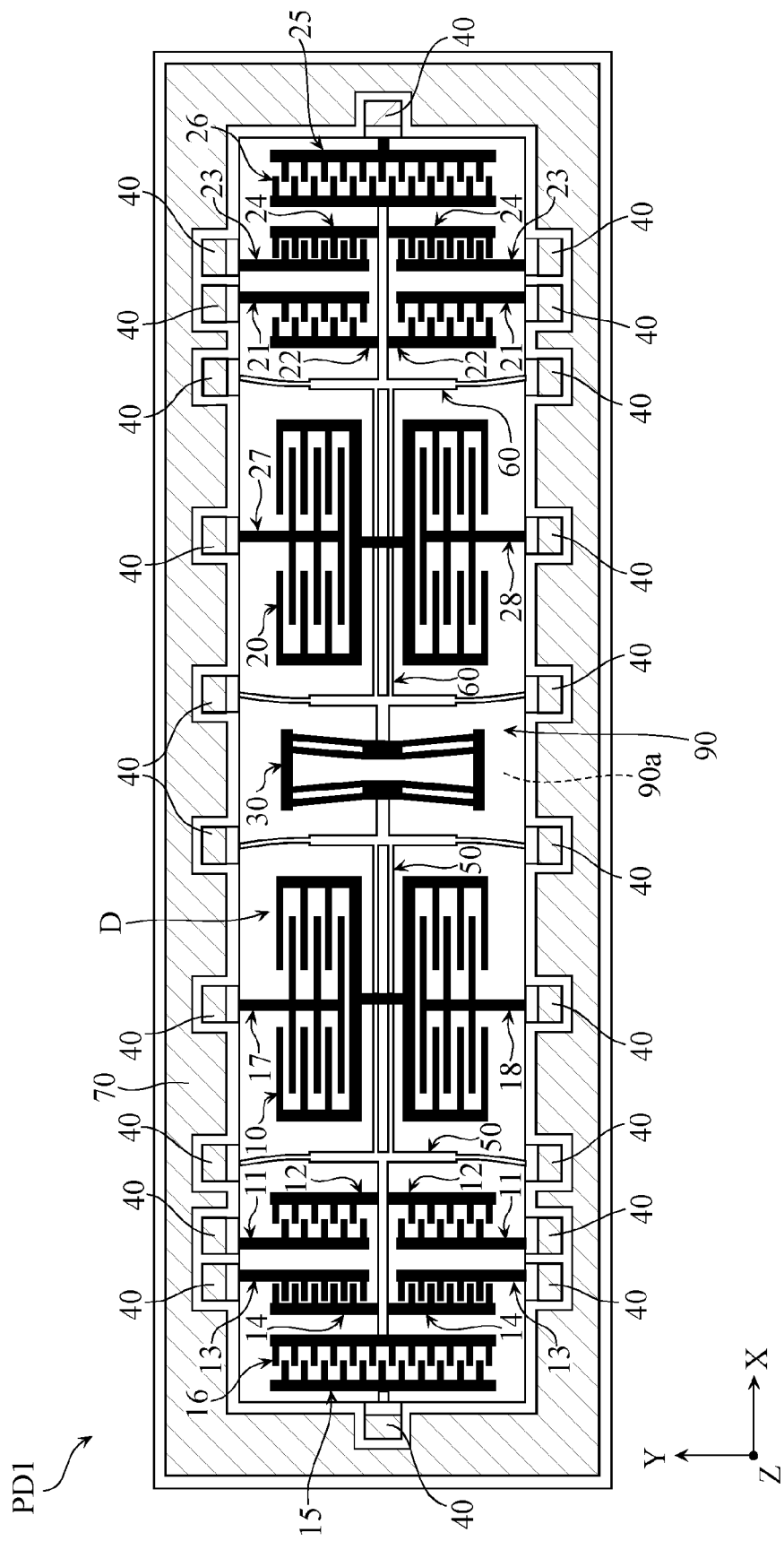
FIG. 20 is another plan view illustrating the packaged device of FIG. 6 with a portion of the packaged device omitted when the packaged device is driven.

In driving the packaged device PD1 or device D, for example, the reference vibration is performed to the vibration units 10 and 20 in the opposite phase in the X-axis direction as illustrated in FIGS. 19 and 20. For example, while a constant bias voltage is applied to the vibration units 10 and 20 and the drive electrodes 12, 14, 22, and 24, a sine-wave voltage (drive voltage) having a phase (phase difference of 180 degrees) opposite to the bias voltage is applied to the drive electrodes 13 and 21, which allows the reference vibration to be realized. The bias voltage applied to the vibration units 10 and 20 and drive electrodes 12, 14, 22, and 24 can be applied through the anchor unit 40, the electrode pad 96A, and the connecting units 50 and 60. The anchor unit 40 is connected to the connecting units 50 and 60, and the electrode pad 96A is electrically connected to the anchor unit 40. A drive voltage can be applied to the drive electrodes 11, 13, 21, and 23 through the electrode pad 96A that is electrically connected to each anchor unit 40.

As described above, the coupling beam unit 30 couples the reference vibrations in the X-axis direction of the vibration units 10 and 20 such that the reference vibrations become the opposite phases. When the coupling beam unit 30 is omitted, it is difficult to accurately perform the reference vibrations of the vibration units 10 and 20 in the opposite phases during the operation. This is because eigenfrequencies of the vibration units 10 and 20 differ actually from each other due to an influence of a forming error of each portion of the movable unit including the vibration units 10 and 20. The coupling beam unit 30 mechanically connects the vibration units 10 and 20 with the connecting units 50 and 60 interposed therebetween, and the reference vibrations of the vibration units 10 and 20 are mechanically correlated, thereby bringing the phase difference between the reference vibrations of the vibration units 10 and 20 close to an ideal value during the drive.

In driving the packaged device PD1 or the device D, the monitor electrodes 15, 16, 25, and 26 act so as to maintain the resonance of the movable unit in a vibration mode in which the reference vibrations of the vibration units 10 and 20 are performed in the opposite phase. Specifically, in a circuit (not illustrated), the displacement amount in the X-axis direction of the vibration unit 10 is detected by the change in electrostatic capacitance between the monitor electrodes 15 and 16, and the detection result is fed back to the drive voltage applied to the drive electrodes 11 and 13, thereby finely adjusting the phase and amplitude of the drive voltage (sine-wave voltage). Further, the displacement amount in the X-axis direction of the vibration unit 20 is detected by the change in electrostatic capacitance between the monitor electrodes 25 and 26, and the detection result is fed back to the drive voltage applied to the drive electrodes 21 and 23, thereby finely adjusting the phase and amplitude of the drive voltage (sine-wave voltage).

Figure 21:
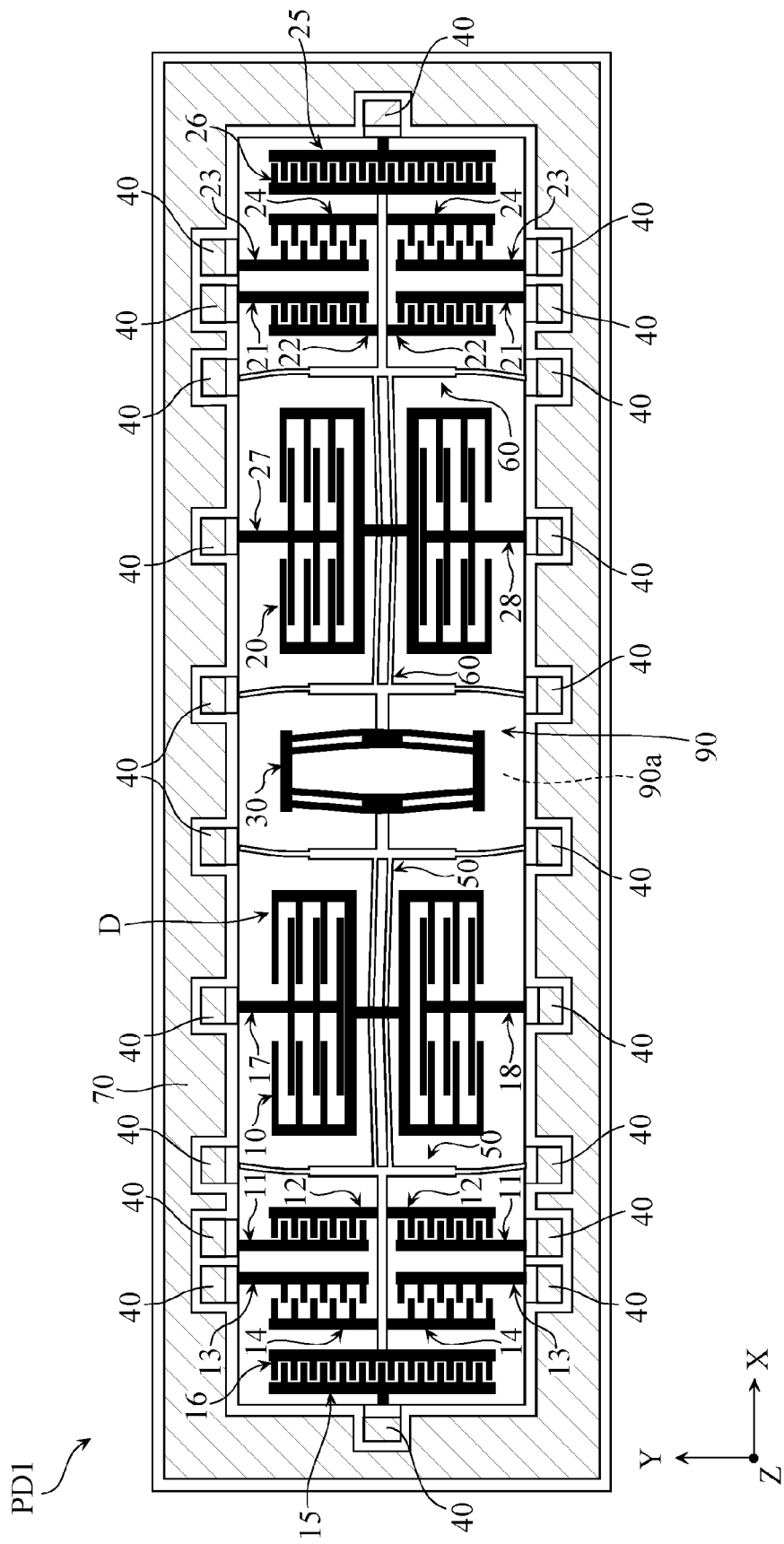
FIG. 21 illustrates an example in which an angular velocity acts on the packaged device of FIG. 6 when the packaged device is driven.

When an angular velocity about a Z-axis (orthogonal to X-axis and Y-axis) of FIG. 19 acts on the vibration units 10 and 20 while the reference vibrations of the vibration units 10 and 20 are performed in the opposite phases, a Coriolis force is periodically generated to displace the vibration units 10 and 20 in the Y-axis direction. Therefore, for example, as illustrated in FIG. 21, the vibration units 10 and 20 are vibrated (Coriolis vibration) in the opposite phases in the Y-axis direction to change the electrostatic capacitance between the vibration unit 10 and the detection electrodes 17 and 18 and the electrostatic capacitance between the vibration unit 20 and the detection electrodes 27 and 28. The displacement amounts or vibration amplitudes of the vibration units 10 and 20 are detected based on the changes in electrostatic capacitances, and the circuit (not illustrated) derives the angular velocity acting on the device D or the vibration units 10 and 20 based on the detection results. In the first embodiment, the packaged device PD1 can act as an angular velocity sensor.

As illustrated in FIGS. 8 and 13, the packaged device PD1 includes an electrode pad 96B that is electrically connected to the non-wiring region 91B of the packaging unit 90. Therefore, in the packaged device PD1, the non-wiring region 91B can be grounded through the electrode pad 96B. When the non-wiring region 91B is grounded, a potential at the non-wiring region 91B can be kept constant during the drive to prevent a signal from leaking from one of the wiring regions 91A to another wiring region 91A through the non-wiring region 91B.

Figure 22A:
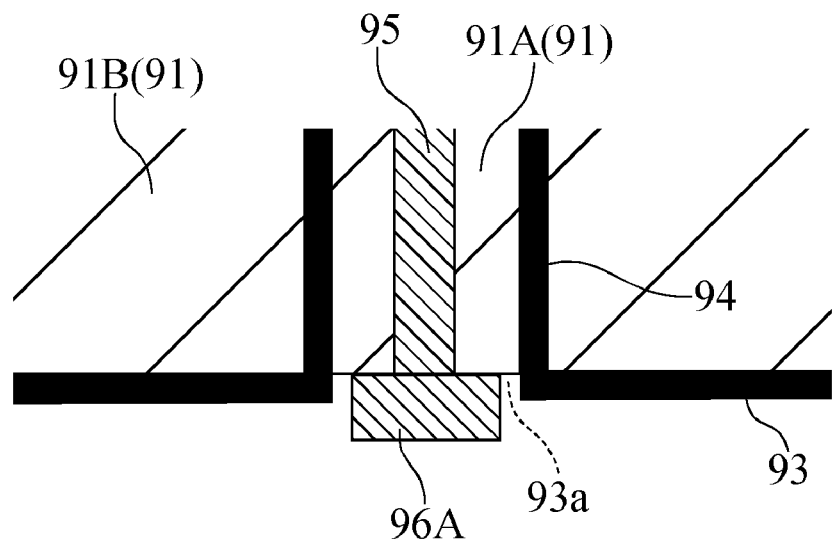
FIGS. 22A and 22B are partially enlarged sectional views illustrating a modification of the packaged device of FIG. 6.

The electrode pad 96A of the packaged device PD1 may be provided as illustrated in FIG. 22A. The electrode pad 96A of FIG. 22A is provided so as to be accommodated in the first opening (opening 93a) of the insulating layer 93 in an in-plane direction of the packaging unit 90. The configuration of FIG. 22A having a large ratio of an area in which the electrode pad 96A is directly bonded to the wiring region 91A (made of a silicon material) while the insulating layer 93 is not interposed therebetween is suitable for enhancement of adhesion of the electrode pad 96A in the surface of the packaging unit 90.

Figure 22B:
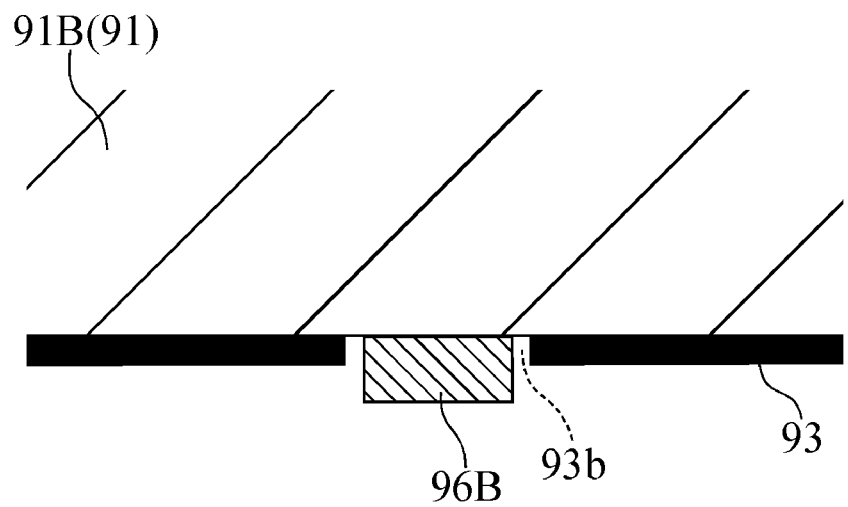

The electrode pad 96B of the packaged device PD1 may be provided as illustrated in FIG. 22B. The electrode pad 96B of FIG. 22B is provided so as to be accommodated in the second opening (opening 93b) of the insulating layer 93 in the in-plane direction of the packaging unit 90. The configuration of FIG. 22B having a large ratio of an area in which the electrode pad 96B is directly bonded to the non-wiring region 91B (made of a silicon material) while the insulating layer 93 is not interposed therebetween is suitable for the enhancement of the adhesion of the electrode pad 96B in the surface of the packaging unit 90.

Figure 26A:
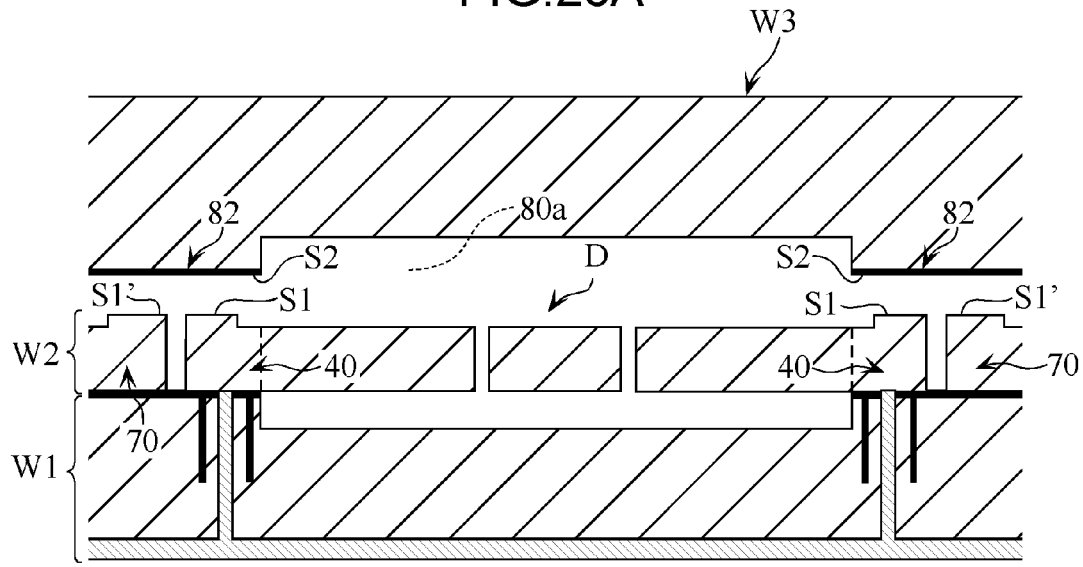
FIGS. 26A to 26C illustrate further processes subsequent to the process of FIG. 25C.
Figure 26B:
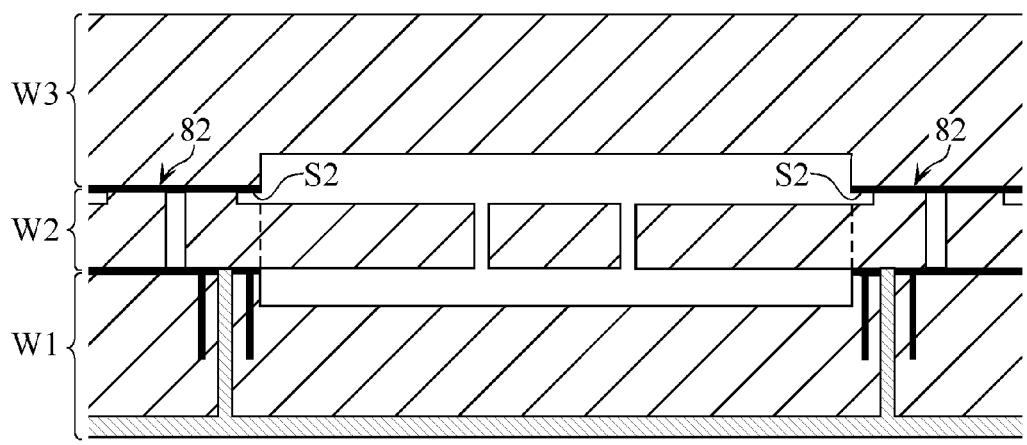
Figure 26C:
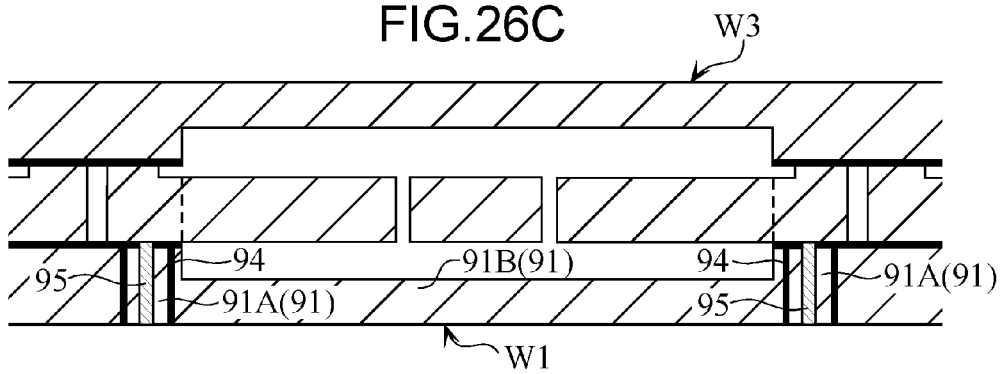
Figure 27A:
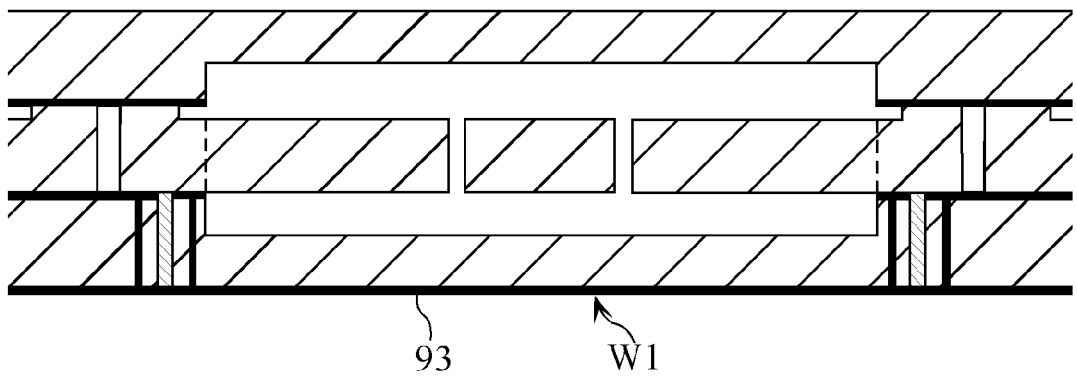
FIGS. 27A to 27C illustrate further processes subsequent to the process of FIG. 26C.
Figure 27B:
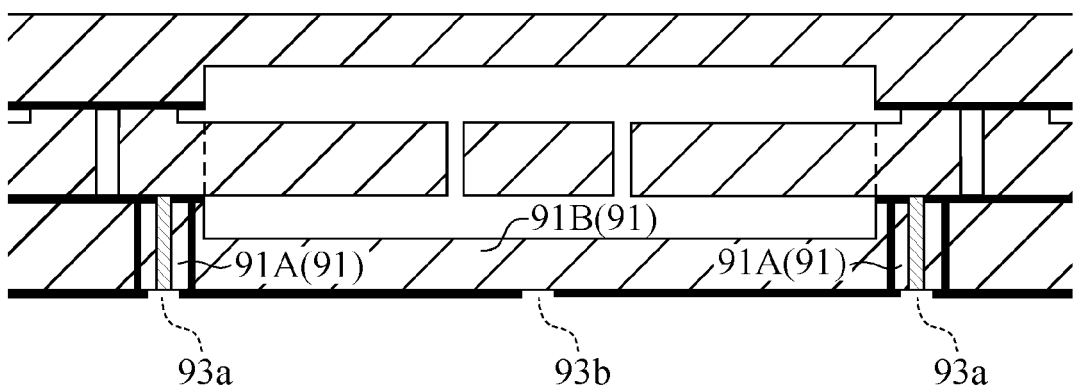
Figure 27C:
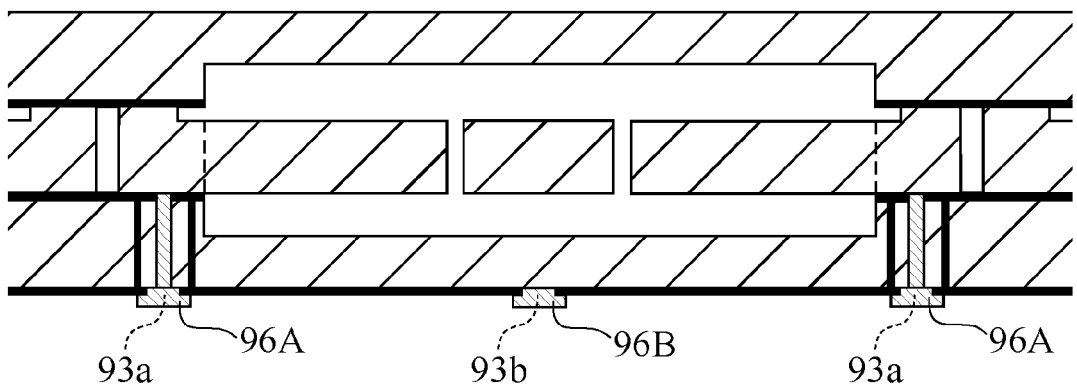
Figure 28A:
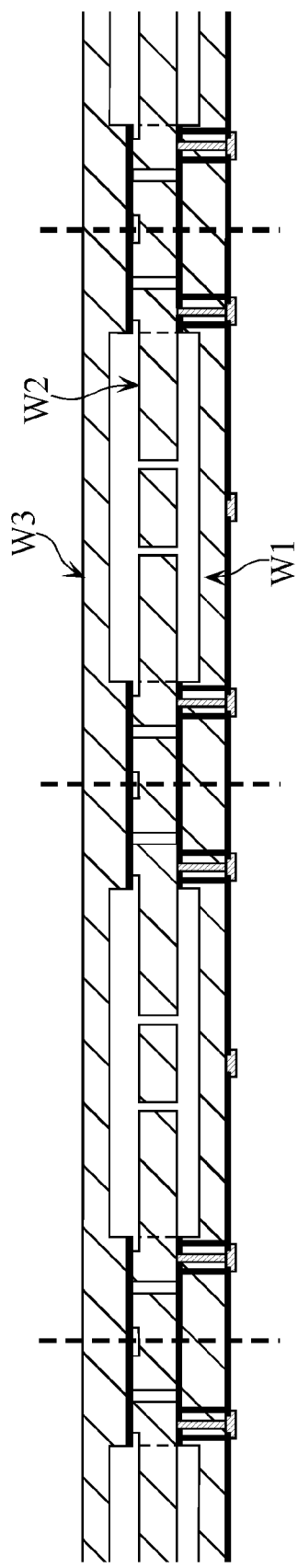
FIGS. 28A and 28B illustrate further processes subsequent to the process of FIG. 27C.
Figure 28B:
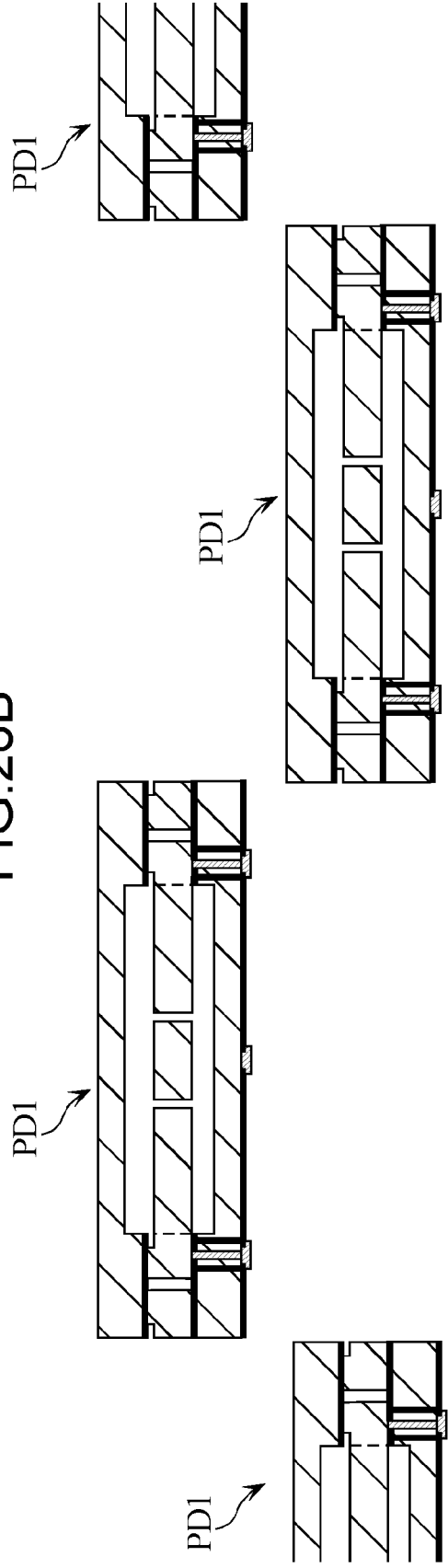

FIGS. 23A to 28B illustrate a method for producing the packaged device PD1 by the bulk micromachining technology. FIGS. 23A to 27C illustrate a change of a section corresponding to that of FIG. 8 included in a partition in which the single packaged device PD1 is formed. FIGS. 28A and 28B illustrate partial sections in the plural device forming partitions.

Figure 23A:
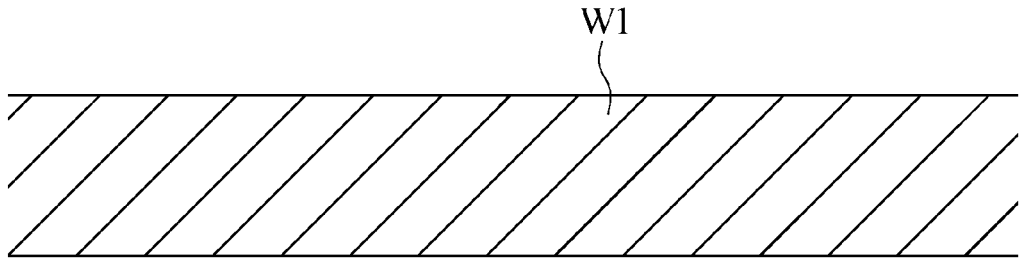
FIGS. 23A to 23D illustrate part of processes in a method for producing the packaged device of FIG. 6.

First a packaging wafer W1 is prepared as illustrated in FIG. 23A. The packaging wafer W1 includes plural partitions that form the packaging units 90. The packaging wafer W1 is a silicon wafer, and is made of a silicon material to which the conductive property is imparted by doping an impurity. A p-type impurity such as B or an n-type impurity such as P and Sb can be adopted as the impurity. For example, the packaging wafer W1 has a thickness of 200 to 500 μm.

Figure 23B:
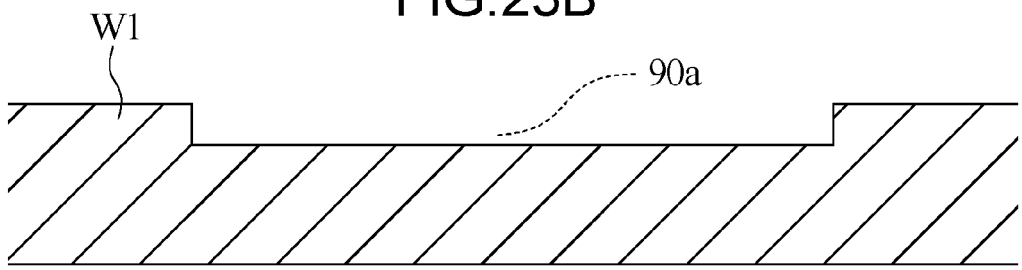

As illustrated in FIG. 23B, the recess 90a is formed in each packaging-unit forming partition of the packaging wafer W1. For example, using a resist pattern having an opening corresponding to the recess 90a as a mask, an etching treatment is performed to the packaging wafer W1 to a predetermined depth (for example, 30 μm) by DRIE (Deep Reactive Ion Etching), which allows the recess 90a to be formed. In DRIE, the good anisotropic etching can be performed in a Bosch process in which etching with a $SF_6$ gas and a side-wall protection performed with a $C_4F_8$ gas are alternately repeated. In the later-described DRIE, the Bosch process can be adopted.

Figure 23C:
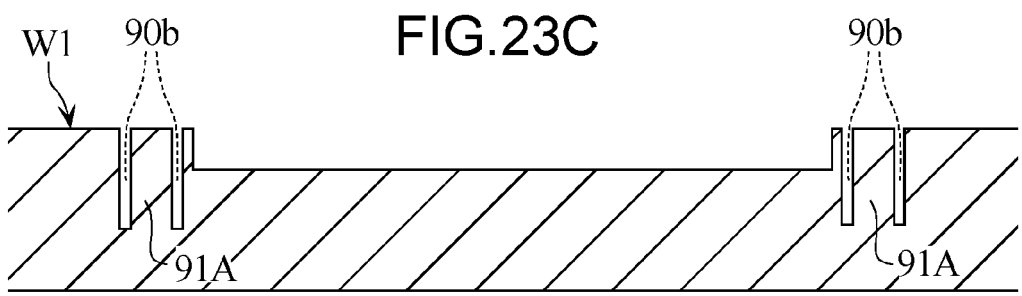

As illustrated in FIG. 23C, a separation trench 90b is formed in each packaging-unit forming partition of the packaging wafer W1, and the wiring region 91A is patterned. For example, using a resist pattern having an opening corresponding to the separation trench 90b as a mask, an etching treatment is performed to the packaging wafer W1 to a predetermined depth (for example, 50 to 200 μm) by DRIE (Deep Reactive Ion Etching), which allows the separation trench 90b to be formed to pattern the wiring region 91A. The insulating wall 94 is provided in the separation trench 90b, and the separation trench 90b surrounds the wiring region 91A.

Figure 23D:
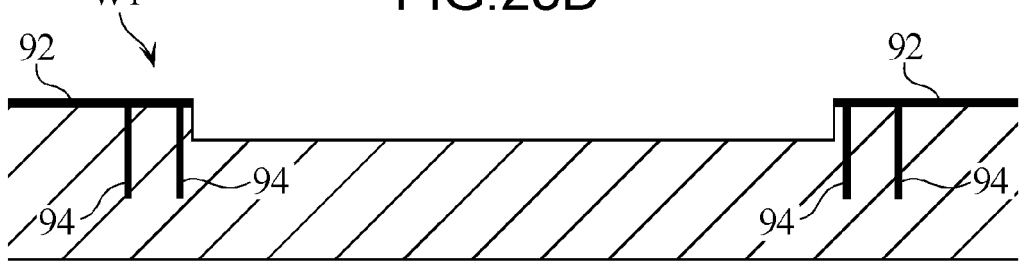

As illustrated in FIG. 23D, the insulating wall 94 is formed in the separation trench 90b, and the insulating layer 92 is also formed therein. For example, after the surface of the packaging wafer W1 is oxidized by a thermal oxidation method to form a thermally-oxidized film, the thermally-oxidized film formed on the wafer surface is removed by etching using a predetermined mask, which allows the insulating layer 92 and the insulating wall 94 to be formed.

Figure 24A:
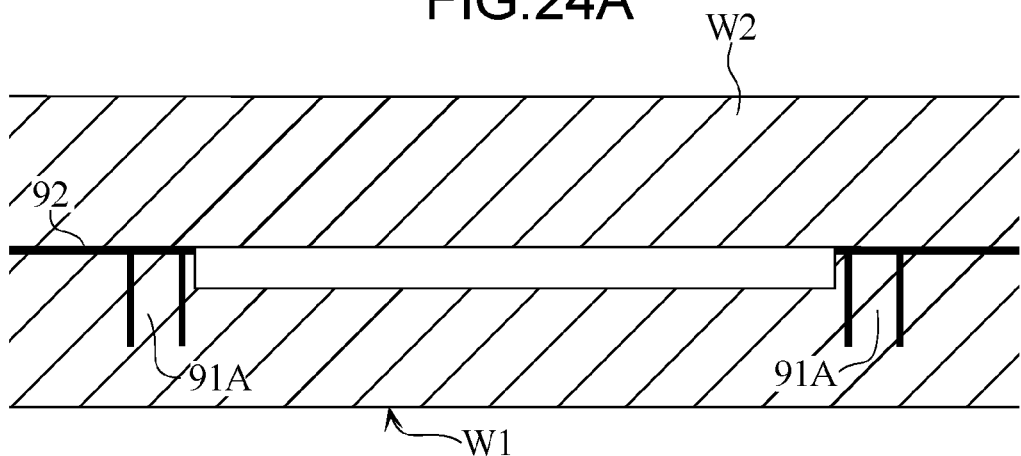
FIGS. 24A to 24C illustrate further processes subsequent to the process of FIG. 23D.

As illustrated in FIG. 24A, the packaging wafer W1 and a device wafer W2 are bonded (non-room-temperature bonding process). The device wafer W2 includes plural device forming partitions that form the devices D. The device wafer W2 is a silicon wafer, and is made of a silicon material to which the conductive property is imparted by doping an impurity. The p-type impurity such as B or the n-type impurity such as P and Sb can be adopted as the impurity. In the bonding process, the device wafer W2 and the side on which the wiring region 91A is formed in the packaging wafer W1 are bonded to each other. For example, the direct bonding method or the plasma activated bonding method is adopted as the bonding technique.

Figure 24B:
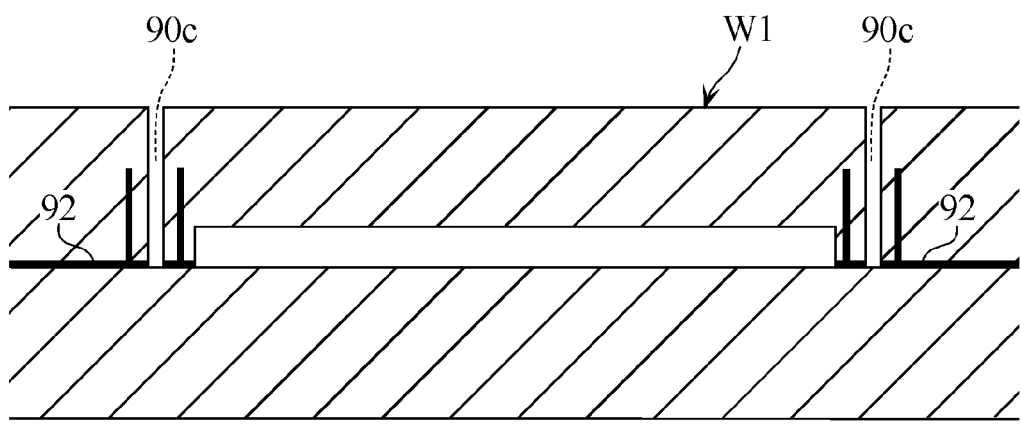

As illustrated in FIG. 24B, a through-hole 90c is made in the packaging wafer W1. In making the through-hole 90c, for example, using a resist pattern having an opening corresponding to the position where the through-hole 90c is made as a mask, the etching treatment is performed to the base material of the packaging wafer W1 by DRIE until the insulating layer 92 is exposed. The point exposed in the insulating layer 92 is removed by the etching. For example, wet etching can be adopted as the etching technique. In the wet etching, buffered hydrofluoric acid (BHF) containing hydrofluoric acid and ammonium fluoride is used as an etching solution. Similarly the wet etching can be adopted for the later-described etching treatment performed to the insulating layer. Therefore, the through-hole 90c piercing through the packaging wafer W1 (or wiring region 91A and insulating layer 92) can be made.

Figure 24C:
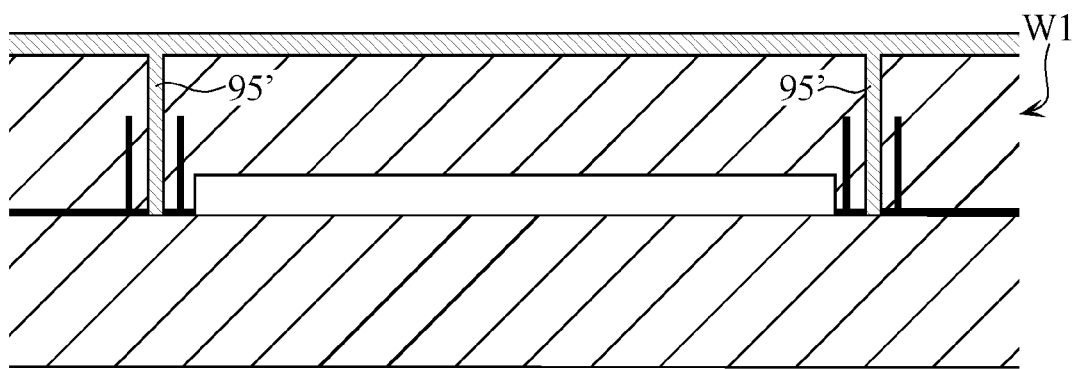

In producing the packaged device PD1, as illustrated in FIG. 24C, the through-hole 90c is filled with a conductive material 95' by an LP-CVD method or an MOCVD method. For example, the conductive material 95' is polysilicon.

Figure 25A:
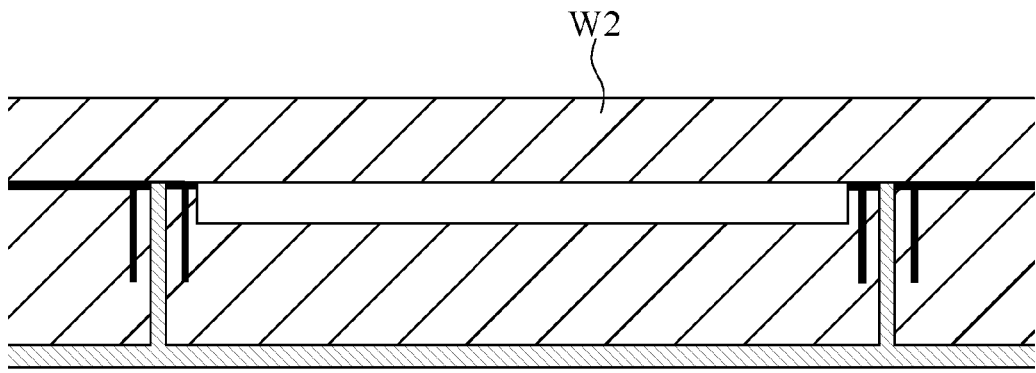
FIGS. 25A to 25C illustrate further processes subsequent to the process of FIG. 24C.

As illustrated in FIG. 25A, the whole of the device wafer W2 is thinned. The device wafer W2 can be thinned by performing a polishing treatment to the device wafer W2. For example, Chemical Mechanical Polishing (CMP) can be adopted as the polishing technique. In the thinning process, the thickness of the device wafer W2 is set to 20 to 100 μm.

Figure 25B:
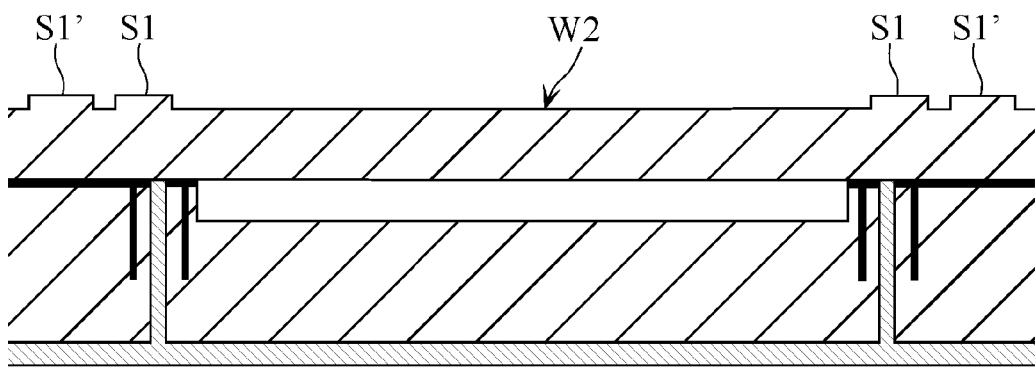

As illustrated in FIG. 25B, slice etching is performed to a predetermined region of the device wafer W2. Specifically, a resist pattern having a pattern shape corresponding to the bonding target surfaces S1 and S1' on the device substrate side is formed in the surface (upper surface of FIG. 25B) of the device wafer W2. Then, using the resist pattern as a mask, the etching treatment is performed to the device wafer W2 to a predetermined depth by DRIE. For example, the predetermined depth ranges from 1 to 5 μm. Therefore, the bonding target surfaces S1 and S1' are formed in the device wafer W2.

Figure 25C:
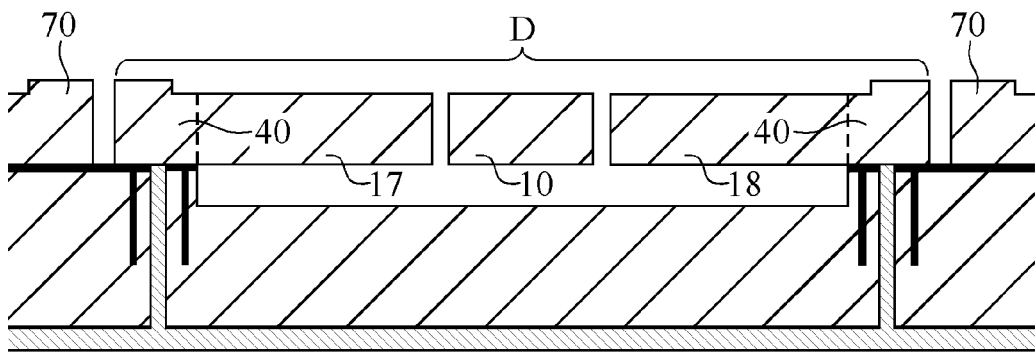

As illustrated in FIG. 25C, the units of the device D and the external wall portion 70 are formed in the device wafer W2 that is hardly broken because of the bonding of the device wafer W2 to the packaging wafer W1. The units of the device D include the vibration units 10 and 20, the drive electrodes 11 to 14 and 21 to 24, the monitor electrodes 15, 16, 25, and 26, the detection electrodes 17, 18, 27, and 28, the coupling beam unit 30, the anchor unit 40, and the connecting units 50 and 60. In the process, for example, the etching treatment is performed to the device wafer W2 by DRIE using a resist pattern having a pattern shape corresponding to the units of the device D and the external wall portion 70 as a mask.

As illustrated in FIGS. 26A and 26B, the device wafer W2 and a packaging wafer W3 are bonded by the room-temperature bonding method (room-temperature bonding process). The packaging wafer W3 includes plural partitions in order to form the packaging units 80, and each packaging-unit forming partition includes the recess 80a. The insulating layer 82 is provided on the surface of the packaging wafer W3. For example, using a resist pattern having an opening corresponding to the recess 80a as a mask, the recess 80a can be formed by performing the etching treatment to the silicon wafer to a predetermined depth (for example, 30 μm) by DRIE. For example, the insulating layer 82 can be formed by patterning a thermally-oxidized film after a silicon wafer surface is oxidized by the thermal oxidation method to form the thermally-oxidized film. As described above, the insulating layer 82 constitutes the bonding target surface S2 in the packaging wafer W3. For example, the packaging wafer W3 has a thickness of 200 to 300 μm. In the process, the wafer-level packaging is achieved for the device D.

The room-temperature bonding method that is adopted as the bonding technique in the process is a technique in which, while surfaces to be bonded in two members of bonding targets are cleaned by performing the sputter etching with predetermined beam irradiation (while the dangling bond of the constituent atom is exposed to activate the surface), the members are bonded in high vacuum. In the room-temperature bonding method, the high-temperature process can be avoided in the bonding, and therefore the problem caused by the high-temperature process can be avoided. When the device wafer W2 is subjected to the high-temperature process after the device D is formed, sometimes each unit of the device D is deformed through the thermal expansion. In order to avoid such problems, the room-temperature bonding method is adopted as the technique of bonding the device wafer W2 and the packaging wafer W3 after the formation of the device D.

In performing the room-temperature bonding process with the room-temperature bonding apparatus 300 of FIG. 4, for example, first the laminated structure of the device wafer W2 and the packaging wafer W1 is retained as the bonding target 305 by the stage 302. The packaging wafer W3 is also retained as the bonding target 306 by the stage 303. The vacuum pump is operated to evacuate the chamber 301 into a high vacuum state. The stages 302 and 303 are operated to cause the bonding target surfaces of the bonding targets 305 and 306 to face each other. Specifically, the bonding target surfaces S1 and S1' of the bonding target 305 (or device wafer W2 that is part of the bonding target 305) and the bonding target surface S2 of the bonding target 306 (that is, packaging wafer W3) face each other. Then the gun 304 irradiates the bonding target surfaces of the bonding targets 305 and 306 with the beam 304a to activate the bonding target surfaces. The irradiation intensity, irradiation time, and irradiation direction of the beam 304a are set such that the bonding target surfaces of the bonding targets 305 and 306 are efficiently activated. Then the stage 303 is activated to lower the bonding target 306, and the bonding target surfaces of the bonding targets 305 and 306 come into contact with each other. Therefore, the bonding targets 305 and 306 are strongly bonded. Specifically, the bonding target surfaces S1 and S1' of the bonding target 305 (or device wafer W2 that is part of the bonding target 305) and the bonding target surface S2 (insulating layer 82) of the bonding target 306 (that is, packaging wafer W3) are strongly bonded.

Then, in producing the packaged device PD1, as illustrated in FIG. 26C, the packaging wafer W1 is thinned and the packaging wafer W3 is thinned (thinning process). For example, CMP or DRIE can be adopted as the thinning technique. Through thinning the packaging wafer W1, the wiring region 91A in the packaging wafer W1 is electrically separated from the non-wiring region 91B by the insulating wall 94, and the conductive plug 95 piercing through the wiring region 91A is formed. For example, the packaging wafer W1 has a thickness of 50 to 200 μm. For example, the packaging wafer W3 has a thickness of 50 to 150 μm.

As illustrated in FIG. 27A, the insulating layer 93 is formed. For example, a predetermined insulating material is deposited on the packaging wafer W1 by the sputtering method or the plasma CVD method, which allows the insulating layer 93 to be formed.

As illustrated in FIG. 27B, the openings 93a and 93b are formed in the insulating layer 93. For example, using a resist pattern having an opening corresponding to the openings 93a and 93b as a mask, the etching treatment can be performed to the insulating layer 93 to form the openings 93a and 93b. The wiring region 91A is exposed in the opening 93a, and the non-wiring region 91B is exposed in the opening 93b.

As illustrated in FIG. 27C, the electrode pads 96A and 96B are formed. In forming the electrode pads 96A and 96B, for example, a predetermined metallic material is deposited on the insulating layer 93 such that the openings 93a and 93b are closed by the sputtering method. The etching treatment is performed to the metallic material film using a resist pattern as a mask. Therefore, the electrode pads 96A and 96B can be patterned.

As illustrated in FIGS. 28A and 28B, the laminated structure including the device wafer W2 and the packaging wafers W1 and W3 are individually cut. In this manner, the packaged device PD1 can be produced.

In the method, because the wafer-level packaging is achieved, deterioration of the operating performance of the movable unit, caused by the adhesion of the dust to each unit of the device D that is the micro movable device or the damage of each unit of the device D, can be prevented.

In the method, through the room-temperature bonding process of FIGS. 26A, 26B, and 4, the beam irradiation is performed in the high-vacuum chamber 301 while the bonding targets 305 and 306 are retained by the stages 302 and 303 and disposed to face each other. Due to the beam irradiation, sputter etching is also performed to the chamber 301 and the metallic structures of the stages 302 and 303, and the metallic structures emit metal (such as Fe, Al, and Cr). The minute amount of metal adheres to or is incorporated into the surfaces of the bonding targets 305 and 306. However, the amount of adhered and incorporated metal is uneven over the entire surfaces of the bonding targets 305 and 306. Specifically, while the relatively small amount of adhered and incorporated metal is even in the surfaces (including bonding target surface) facing each other in the bonding targets 305 and 306, many points having relatively large amount of adhered and incorporated metal exist in the surfaces that do not face each other.

In the packaged device PD1, the bonding target surface S1 of the anchor unit 40 in the device substrate and the bonding target surface S1' of the external wall portion 70 and the bonding target surface S2 in the insulating layer 82 of the packaging unit 80 are bonded by the room-temperature bonding method. Therefore, as described above with reference to FIG. 18, the metal concentration in the part or whole of the peripheral surface 82b of the insulating layer 82 is higher than the metal concentration in an end surface 82a on the device substrate side of the insulating layer 82. That is, an insulating property in the part or whole of the peripheral surface 82b of the insulating layer 82 of the packaging unit 80 is lowered through the bonding process by the room-temperature bonding method.

However, in the bonding target surfaces S1 and S2 of the packaged device PD1, the outline of the bonding target surface S1 is retreated inward from the outline of the bonding target surface S2. That is, the bonding target surface S1 of the device D or anchor unit 40 in the device substrate does not come into contact with the peripheral surface 82b of the insulating layer 82, which constitutes the bonding target surface S2 of the packaging unit 80. Therefore, in the packaged device PD1, when the potential difference is generated between the device D and the base material 81 of the packaging unit 80, the leak current passed through the point where the insulating property of the peripheral surface 82b of the insulating layer 82 is lowered is hardly generated between the device D and the base material 81. Accordingly, the packaged device PD1 is suitable for the electric separation between the device D and the base material 81 of the packaging unit 80. The electric separation between the device D and the base material 81 is necessary to avoid the electric connection of the units of the device D to one another through the base material 81 of the packaging unit 80. As described above, preferably the length by which the outline of the bonding target surface S1 is retreated inward from the outline of the bonding target surface S2 is 10 μm or more, and the insulating layer 82 has the thickness of 50 nm or more. These configurations contribute to the electric separation between the device D and the base material 81 of the packaging unit 80.

In the bonding target surfaces S1' and S2 of the packaged device PD1, the outline of the bonding target surface S1' is retreated inward from the outline of the bonding target surface S2. That is, the bonding target surface S1' of the external wall portion 70 in the device substrate does not come into contact with the peripheral surface 82b of the insulating layer 82, which constitutes the bonding target surface S2 of the packaging unit 80. Therefore, in the packaged device PD1, when the potential difference is generated between the external wall portion 70 and the base material 81 of the packaging unit 80, the leak current passed through the point where the insulating property of the peripheral surface 82*b* of the insulating layer 82 is lowered is hardly generated between the external wall portion 70 and the base material 81. Accordingly, the packaged device PD1 is suitable for the electric separation between the external wall portion 70 and the base material 81 of the packaging unit 80. The electric separation between the external wall portion 70 and the base material 81 is necessary to avoid the electric connection of the units of the device D to one another through the base material 81 and the external wall portion 70. As described above, preferably the length by which the outline of the bonding target surface S1' is retreated inward from the outline of the bonding target surface S2 is 10 μm or more, and the insulating layer 82 has the thickness of 50 nm or more. These configurations contribute to the electric separation between the external wall portion 70 and the base material 81 of the packaging unit 80.

Additionally, the method is suitable for the low-profile package, suitable to ensure the strength and the ease of handling of the packaging wafers W1 and W3 before the packaging wafers W1 and W3 are bonded to the device wafer W2, and suitable to suppress the number of processes. This is attributed to the following reason.

As described above, the packaging wafer W1 in the method includes plural partitions in which the packaging units 90 are formed in the produced packaged device PD1. Referring to FIG. 24A, the thickness of the packaging wafer W1 used in the non-room-temperature bonding process is not identical to the thickness of the packaging unit 90 that is part of the packaged device PD1. The packaging wafer W1 that is thicker than the packaging unit 90 is used in the non-room-temperature bonding process. After the non-room-temperature bonding process, the processing is performed to the packaging wafer W1 that is hardly broken because of the bonding of the packaging wafer W1 to the device wafer W2 in the thinning process of FIG. 26C, whereby the packaging wafer W1 is thinned to a desired extent. The packaging unit 90 is derived from the thinned packaging wafer W1. Because the packaging unit 90 is easily thinned in the method, the method is suitable for the produced packaged device PD1 or the low-profile package.

As described above, the packaging wafer W3 in the method includes plural partitions in which the packaging units 80 are formed in the produced packaged device PD1. Referring to FIGS. 26A and 26B, the thickness of the packaging wafer W3 used in the room-temperature bonding process is not identical to the thickness of the packaging unit 80 that is part of the packaged device PD1. The packaging wafer W3 that is thicker than the packaging unit 80 is used in the room-temperature bonding process. After the room-temperature bonding process, the processing is performed to the packaging wafer W3 that is hardly broken because of the bonding of the packaging wafer W3 to the device wafer W2 in the thinning process of FIG. 26C, whereby the packaging wafer W3 is thinned to a desired extent. The packaging unit 80 is derived from the thinned packaging wafer W3. Because the packaging unit 80 is easily thinned in the method, the method is suitable for the produced packaged device PD1 or the low-profile package.

In the method, the number of processes is easy to suppress. When the packaged sensing device including the plural conductive plugs piercing through the packaging unit is produced by the conventional method, a number of processes are necessary to bury the conductive plug in the packaging unit. Specifically, the insulating film, a diffusion preventing layer, and an electro-plating seed layer are sequentially formed in an inner wall of each through-hole after the through-hole is made in the packaging wafer, and then the through-hole is filled with a predetermined metal material by the electro-plating method. The conventional method in which a number of processes are necessary is not suitable from the viewpoint of production cost. On the other hand, in the method of the first embodiment, when the conductive plug 95 piercing through the packaging unit 90 is formed, it is not necessary to form the diffusion preventing layer. In the method of the first embodiment, the conductive plug 95 is provided so as to pierce through the wiring region 91A in the packaging unit 90 (that is, the wiring region 91A exists around the conductive plug 95). Therefore, in the method of the first embodiment, it is not necessary to provide the diffusion preventing layer around the conductive plug 95 in order to suppress the diffusion of the metal from the conductive plug 95. Additionally, in the method, when the conductive plug 95 is formed, it is not necessary to form the electro-plating seed layer. Accordingly, in the method, the number of processes is easy to suppress.

As described above, the method of the first embodiment is suitable to the low-profile package, suitable to ensure the strength and the ease of handling of the packaging wafers W1 and W3 before the packaging wafers W1 and W3 are bonded to the device wafer W2, and suitable to suppress the number of processes.

Figure 29:
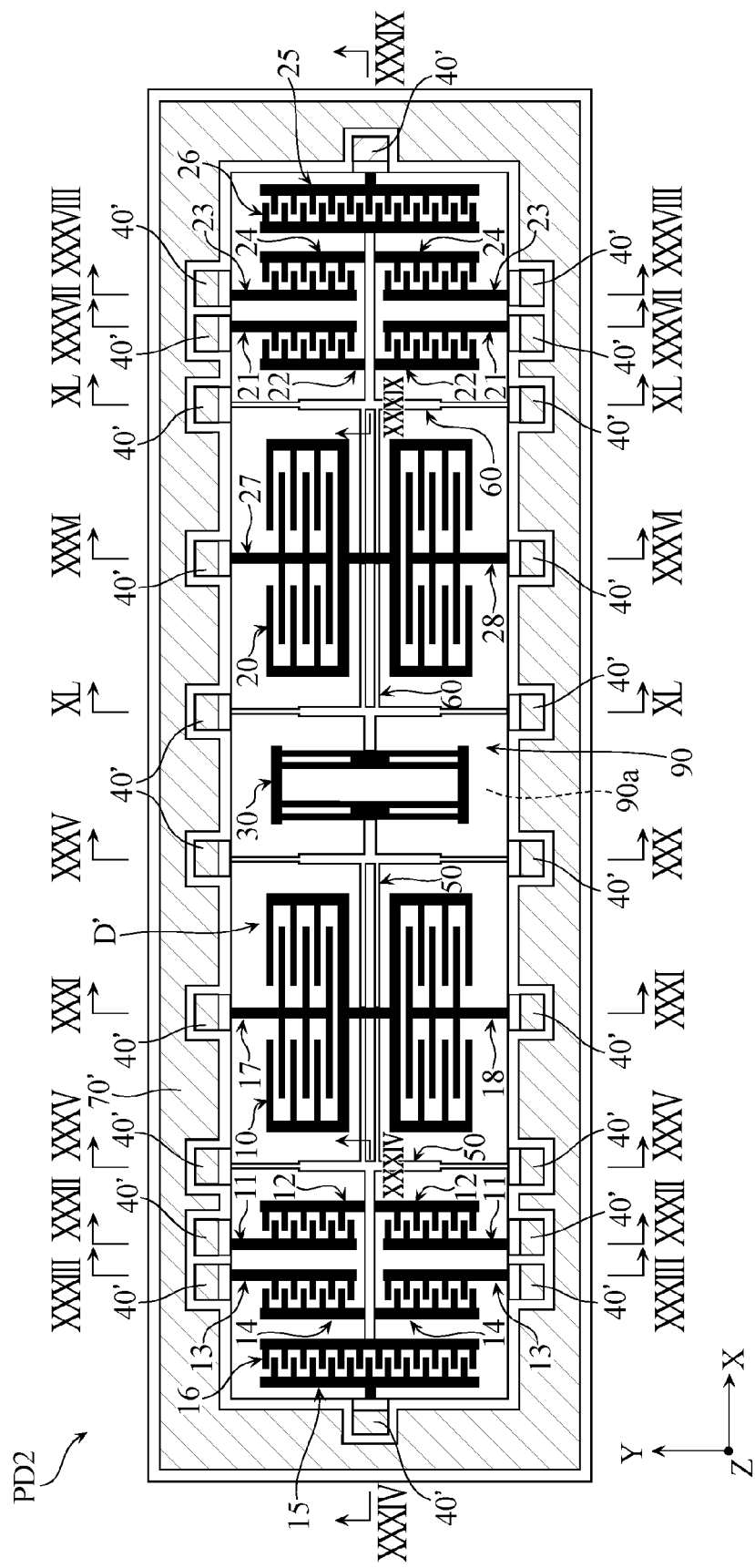
FIG. 29 is a plan view illustrating a packaged device according to a second embodiment with a portion of the packaged device omitted.
Figure 30:
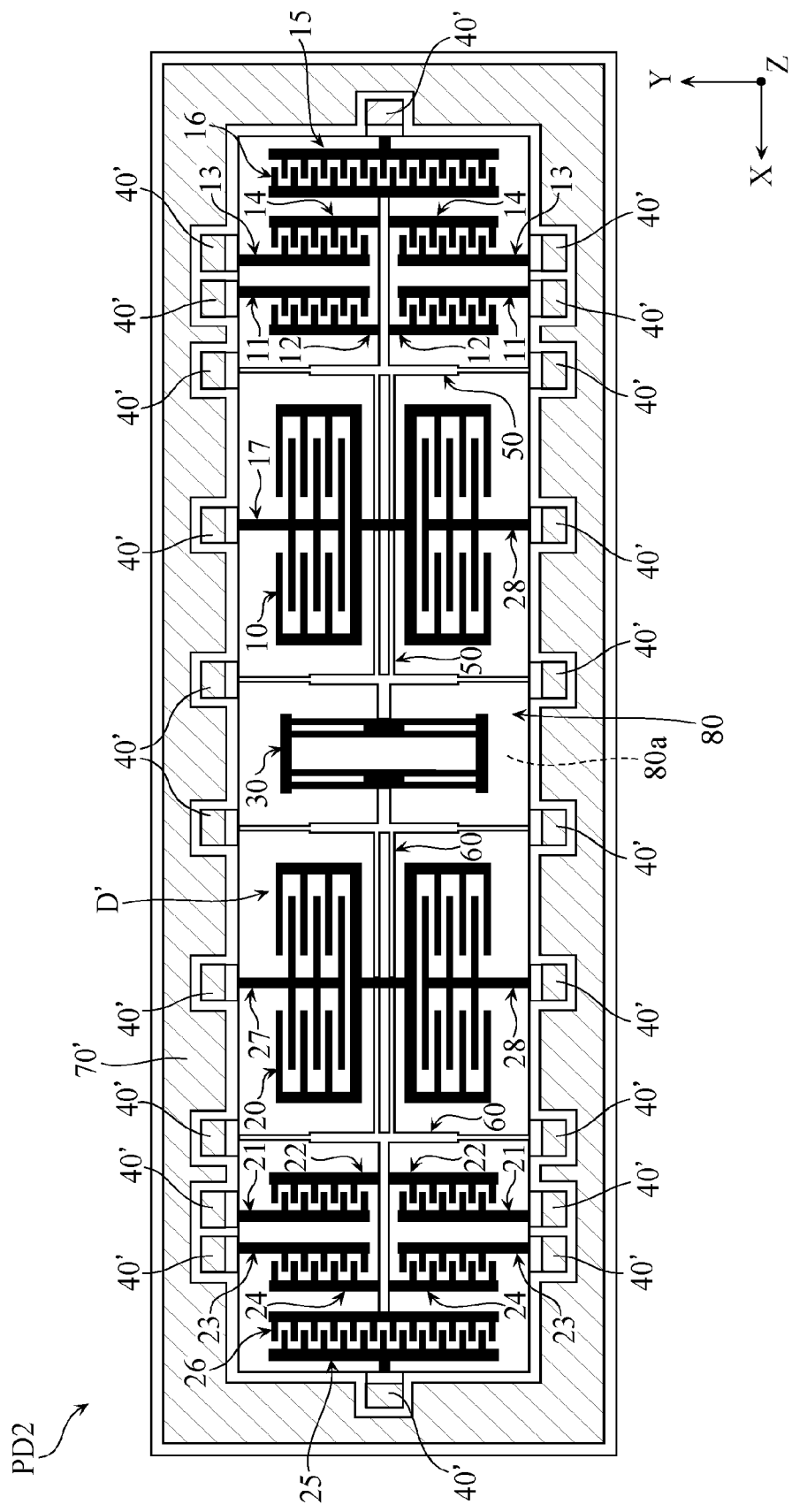
FIG. 30 is another plan view illustrating the packaged device of the second embodiment with a portion of the packaged device omitted.
Figure 31:
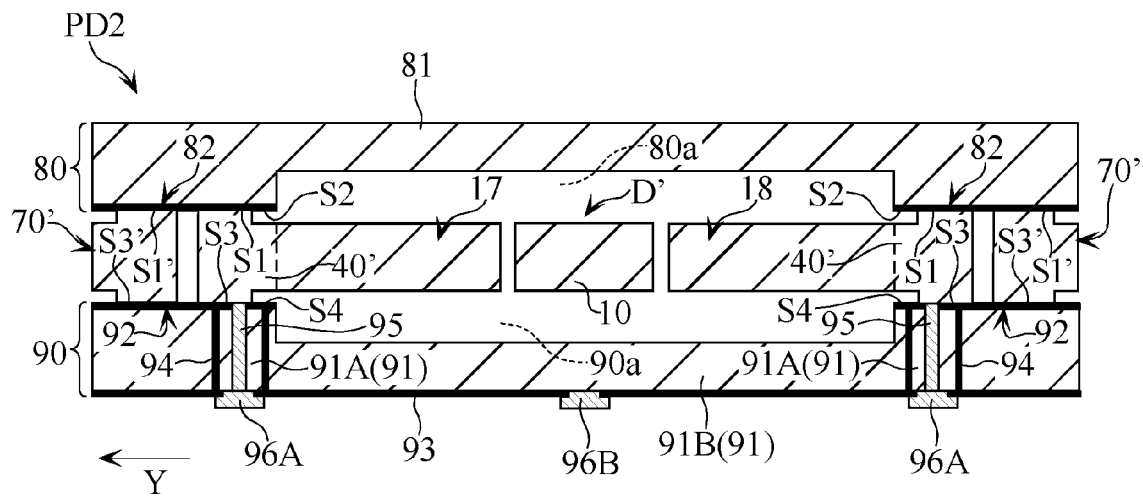
FIG. 31 is an enlarged sectional view taken on a line XXXI-XXXI of FIG. 29.
Figure 32:
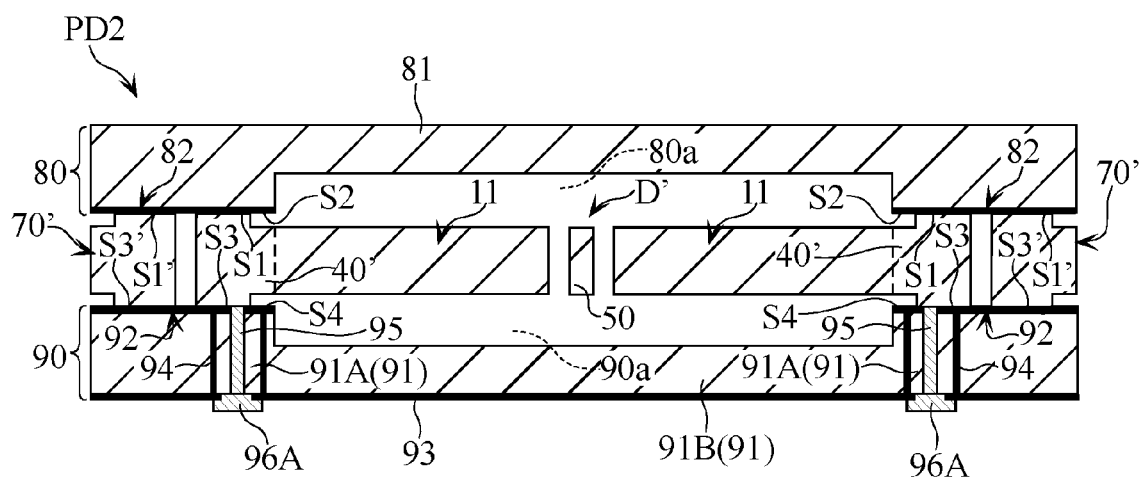
FIG. 32 is an enlarged sectional view taken on a line XXXII-XXXII of FIG. 29.
Figure 33:
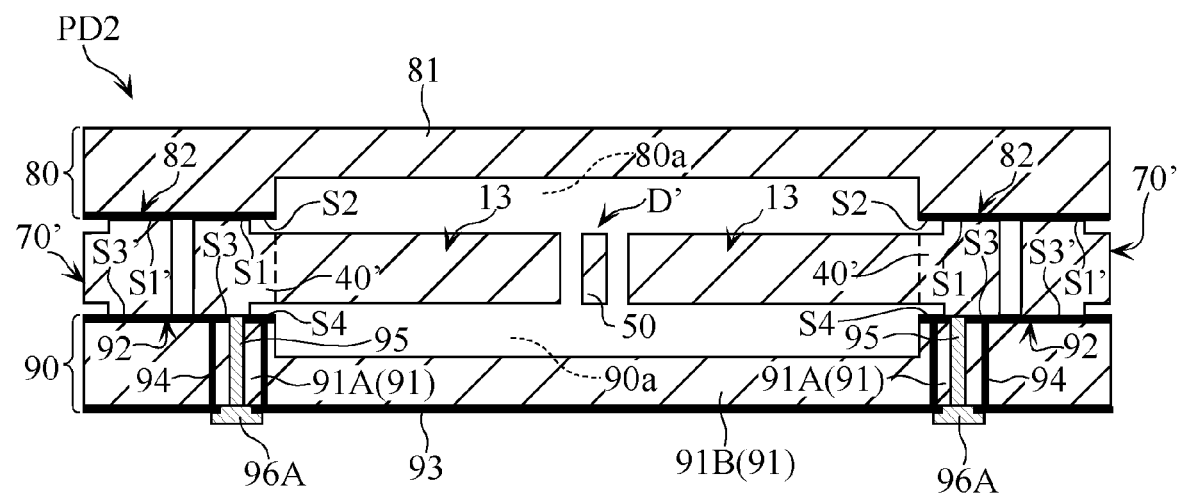
FIG. 33 is an enlarged sectional view taken on a line XXXIII-XXXIII of FIG. 29.
Figure 34:
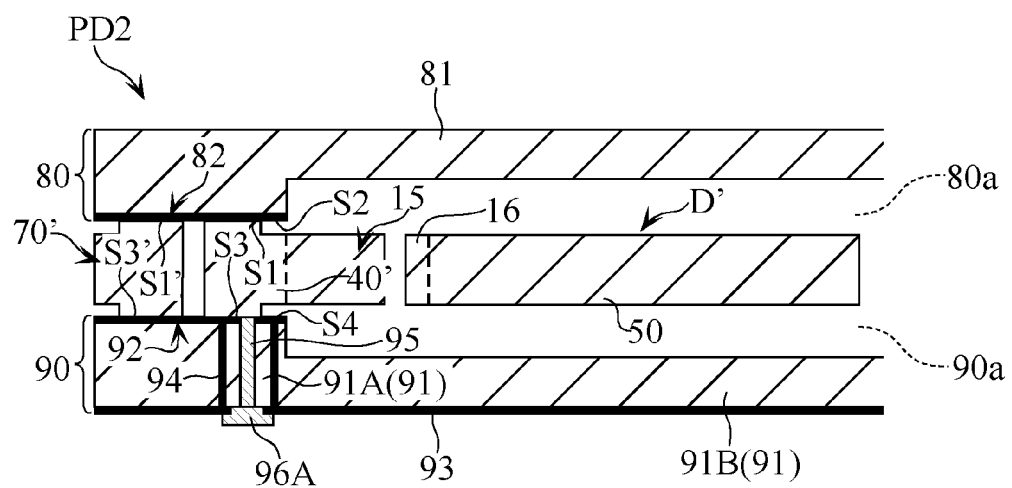
FIG. 34 is an enlarged sectional view taken on a line XXXIV-XXXIV of FIG. 29.
Figure 35:
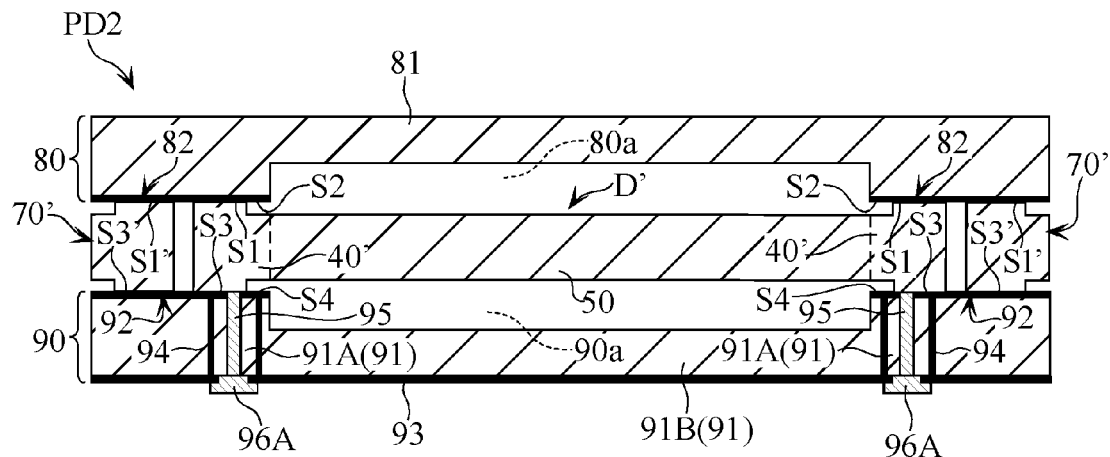
FIG. 35 is an enlarged sectional view taken on a line XXXV-XXXV of FIG. 29.
Figure 36:
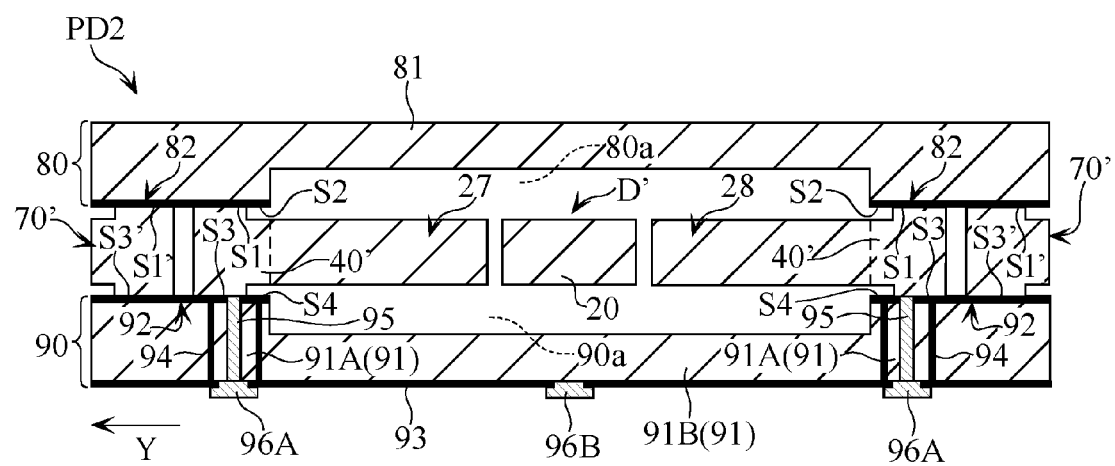
FIG. 36 is an enlarged sectional view taken on a line XXXVI-XXXVI of FIG. 29.
Figure 37:
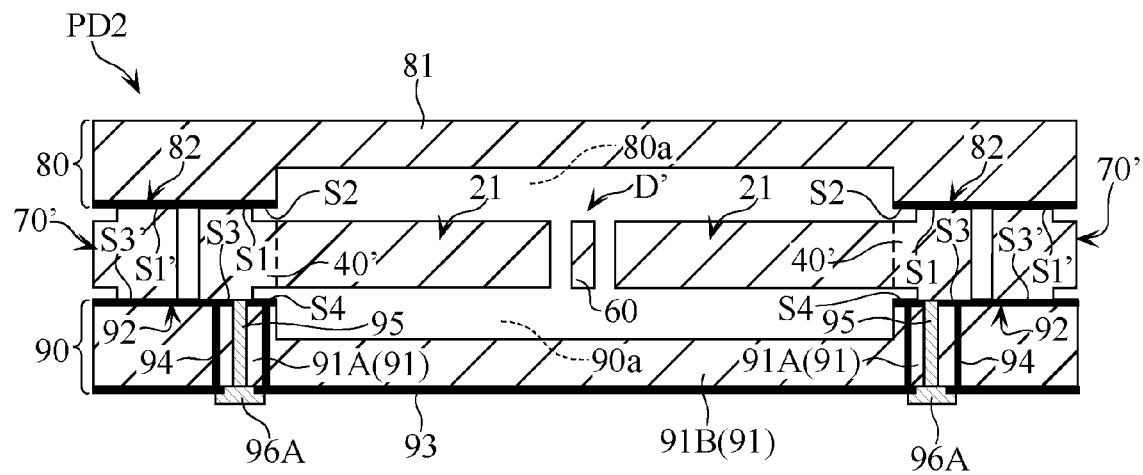
FIG. 37 is an enlarged sectional view taken on a line XXXVII-XXXVII of FIG. 29.
Figure 38:
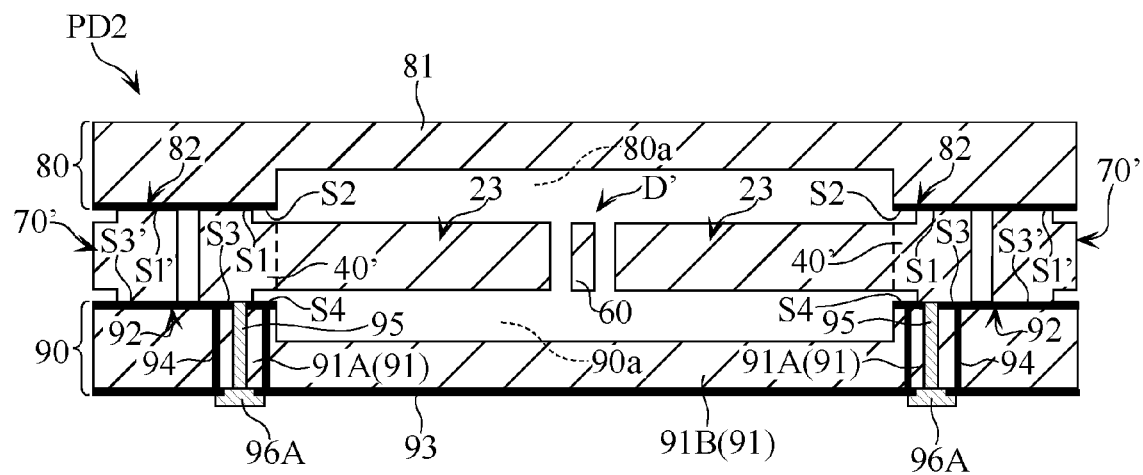
FIG. 38 is an enlarged sectional view taken on a line XXXVIII-XXXVIII of FIG. 29.
Figure 39:
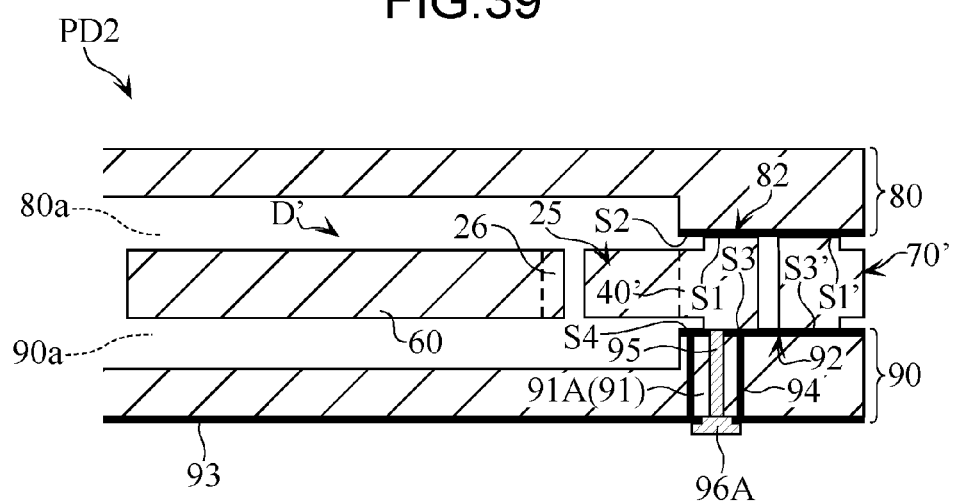
FIG. 39 is an enlarged sectional view taken on a line XXXIX-XXXIX of FIG. 29.
Figure 40:
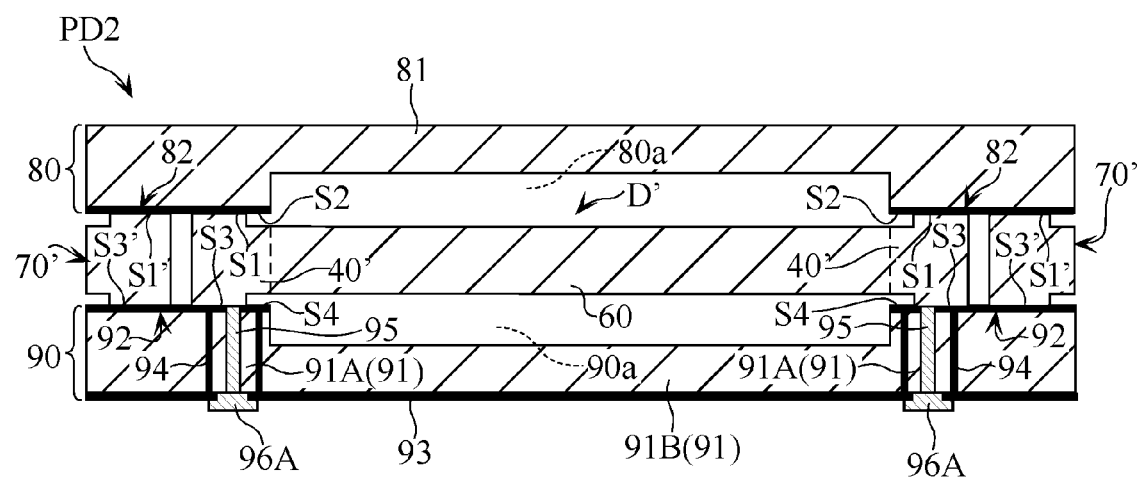
FIG. 40 is an enlarged sectional view taken on a line XL-XL of FIG. 29.

FIGS. 29 to 40 illustrate a packaged device PD2 according to a second embodiment. FIG. 29 is a plan view illustrating the packaged device PD2 with a portion of the packaged device omitted. FIG. 30 is another plan view of the packaged device PD2 with a portion of the packaged device omitted. FIGS. 31 to 40 are enlarged sectional views taken on a line XXXI-XXXI, a line XXXII-XXXII, a line XXXIII-XXXIII, a line XXXIV-XXXIV, a line XXXV-XXXV, a line XXXVI-XXXVI, a line XXXVII-XXXVII, a line XXXVIII-XXXVIII, a line XXXIX-XXXIX, and a line XL-XL, respectively, of FIG. 29.

The packaged device PD2 includes a device D', an external wall portion 70', the packaging unit 80, and the packaging unit 90. The packaging unit 80 is omitted in FIG. 29. FIG. 30 is a plan view on the opposite side of the plan view of FIG. 29. In FIG. 30, the packaging unit 90 is omitted. The packaged device PD2 differs constitutionally from the packaged device PD1 in that the device D' and the external wall portion 70' are provided instead of the device D and the external wall portion 70.

The device D' is an angular velocity sensor. Referring to FIGS. 29 and 30, the device D' includes the vibration units 10 and 20, the coupling beam unit 30, an anchor unit 40', and the connecting units 50 and 60. The device D' also includes the drive electrodes 11, 12, 13, 14, 21, 22, 23, and 24, the monitor electrodes 15, 16, 25, and 26, and the detection electrodes 17, 18, 27, and 28. The device D' differs constitutionally from the device D of the packaged device PD1 in that the anchor unit 40' is provided instead of the anchor unit 40. The vibration units 10 and 20, drive electrodes 12, 14, 22, and 24, the monitor electrodes 16 and 26, the coupling beam unit 30, and the connecting units 50 and 60 constitute the movable unit in the device D'. The drive electrodes 11, 13, 21, and 23, the monitor electrodes 15 and 25, the detection electrodes 17, 18, 27, and 28, and the anchor unit 40' constitute the fixed unit in the device D'. Each anchor unit 40' constitutes the externally connecting terminal portion of the device D'.

Each anchor unit 40' is fixed between the packaging units 80 and 90. FIGS. 31 to 40 illustrate the anchor unit 40' interposed between the packaging units 80 and 90. Each anchor unit 40' is bonded to the packaging units 80 and 90, and includes the bonding target surface S1 bonded to the packaging unit 80 and a bonding target surface S3 connected to the packaging unit 90. The drive electrodes 11, 13, 21, and 23 that are the fixed drive electrodes, the monitor electrodes 15 and 25 that are the fixed monitor electrodes, and the detection electrodes 17, 18, 27, and 28 include the anchor units 40', respectively. The connecting units 50 and 60 are connected to the anchor unit 40'.

The external wall portion 70' has a shape surrounding the device D' as illustrated in FIGS. 29 and 30, and is interposed between the packaging units 80 and 90 as illustrated in FIGS. 31 to 40. The external wall portion 70' is bonded to the packaging units 80 and 90, and the external wall portion 70' includes the bonding target surface S1' bonded to the packaging unit 80 and a bonding target surface S3' bonded to the packaging unit 90.

Figure 41A:
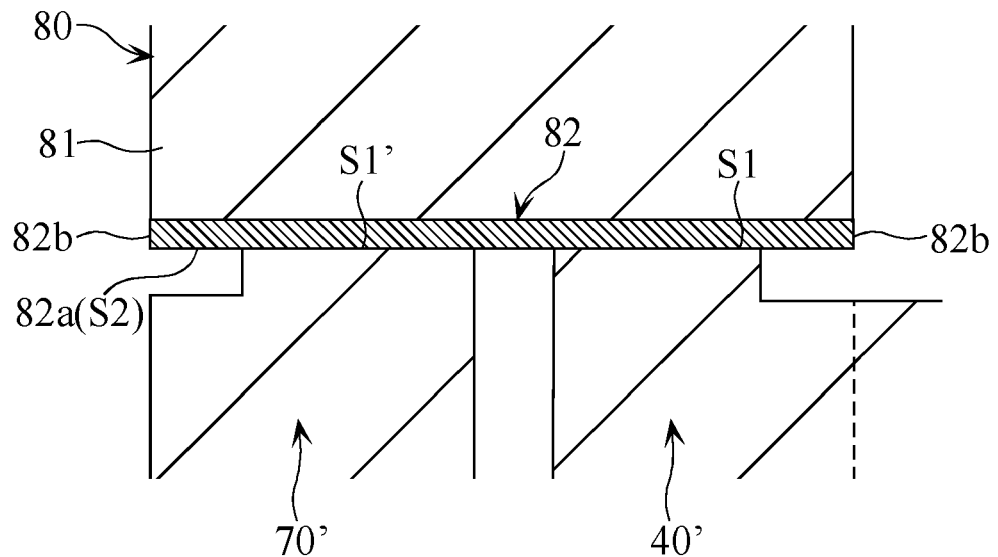
FIGS. 41A and 41B are partially enlarged views of FIG. 40.

As with the packaging unit 80 of the first embodiment, the packaging unit 80 of the packaged device PD2 includes the base material 81, the insulating layer 82, and the recess 80a that is located in the point corresponding to the movable unit of the device D'. As illustrated in FIGS. 31 to 40, the packaging unit 80 is bonded to the anchor unit 40' and external wall portion 70' of the device D' with the insulating layer 82 interposed therebetween. Specifically, the insulating layer 82 constitutes the bonding target surface S2 of the packaging unit 80, and the bonding target surface S2, the bonding target surface S1 of each anchor unit 40' on the device substrate side, and the bonding target surface S1' of the external wall portion 70' are bonded to each other by the room-temperature bonding method. The insulating layer 82 constituting the bonding target surface S2 of the packaging unit 80 is used to achieve the electric separation between the device substrate or device D' and the base material 81 of the packaging unit 80. Preferably the insulating layer 82 has the thickness of 50 nm or more. For example, as illustrated in FIG. 41A, the insulating layer 82 includes the end surface 82a that is located on the device substrate side and the peripheral surface 82b that forms an outline of the bonding target surface S2. The metal concentration of at least part of the peripheral surface 82b is higher than the metal concentration of the end surface 82a. The outline of the bonding target surface S1 of each anchor unit 40' in the device substrate is retreated inward from the outline of the bonding target surface S2 of the packaging unit 80. Preferably the length by which the outline of the bonding target surface S1 is retreated inward from the outline of the bonding target surface S2 is 10 μm or more. Further, the outline of the bonding target surface S1' of the external wall portion 70' in the device substrate is retreated inward from the outline of the bonding target surface S2 of the packaging unit 80. Preferably the length by which the outline of the bonding target surface S1' is retreated inward from the outline of the bonding target surface S2 is 10 μm or more.

Figure 41B:
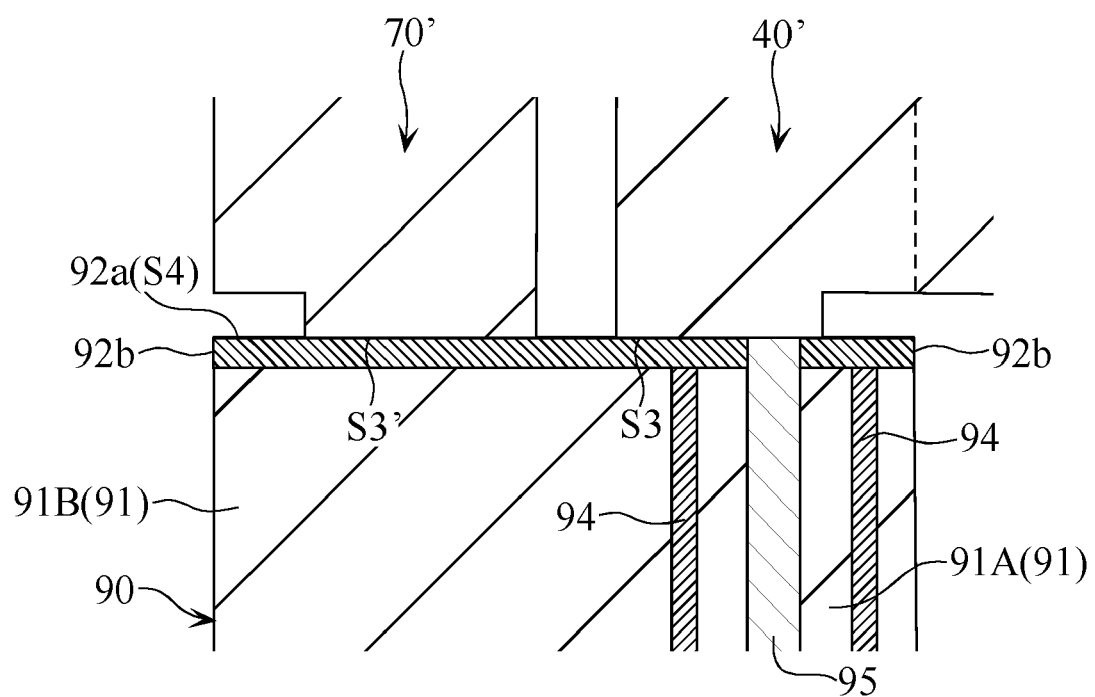

As with the packaging unit 90 of the first embodiment, the packaging unit 90 of the packaged device PD2 includes the base material 91, the insulating layers 92 and 93, the insulating wall 94, the conductive plug 95, and the electrode pads 96A and 96B. The base material 91 includes the wiring region 91A and the non-wiring region 91B. The packaging unit 90 also includes the recess 90a located in the point corresponding to the movable unit of the device D'. As illustrated in FIGS. 31 to 40, the packaging unit 90 is bonded to the anchor unit 40' and external wall portion 70' of the device D' with the insulating layer 92 interposed therebetween. Specifically, the insulating layer 92 constitutes a bonding target surface S4 of the packaging unit 90, and the bonding target surface S4, the bonding target surface S3 of each anchor unit 40' on the device substrate side, and the bonding target surface S3' of the external wall portion 70' are bonded to each other by the room-temperature bonding method. The insulating layer 92 constituting the bonding target surface S4 of the packaging unit 90 is used to achieve the electric separation between the device substrate or device D' and the non-wiring region 91B of the packaging unit 90. Preferably the insulating layer 92 has the thickness of 50 nm or more. For example, as illustrated in FIG. 41B, the insulating layer 92 includes the end surface 92a that is located on the device substrate side and the peripheral surface 92b that forms an outline of the bonding target surface S4. The metal concentration of at least part of the peripheral surface 92b is higher than the metal concentration of the end surface 92a. The outline of the bonding target surface S3 of each anchor unit 40' in the device substrate is retreated inward from the outline of the bonding target surface S4 of the packaging unit 90. Preferably the length by which the outline of the bonding target surface S3 is retreated inward from the outline of the bonding target surface S4 is 10 μm or more. Further, the outline of the bonding target surface S3' of the external wall portion 70' in the device substrate is retreated inward from the outline of the bonding target surface S4 of the packaging unit 90. Preferably the length by which the outline of the bonding target surface S3' is retreated inward from the outline of the bonding target surface S4 is 10 μm or more.

The device D' is sealed by the packaging units 80 and 90 and the external wall portion 70'. The packaged device PD2 is vacuum-sealed.

The packaged device PD2 may electrically be connected to an external circuit. Specifically, for example, each terminal portion (electrode pads 96A and 96B) provided in the packaging unit 90 and a predetermined terminal portion of the external circuit provided on the wiring board may mechanically and electrically be connected through the bump.

As with the packaged device PD1, the packaged device PD2 is driven (that is, the reference vibrations of the vibration units 10 and 20 are performed in the opposite phases in the X-axis direction) and the packaged device PD2 can act as the angular velocity sensor.

As with the electrode pads 96A and 96B in the packaged device PD1, the electrode pads 96A and 96B in the packaged device PD2 may be provided as illustrated in FIGS. 22A and 22B.

Figure 45A:
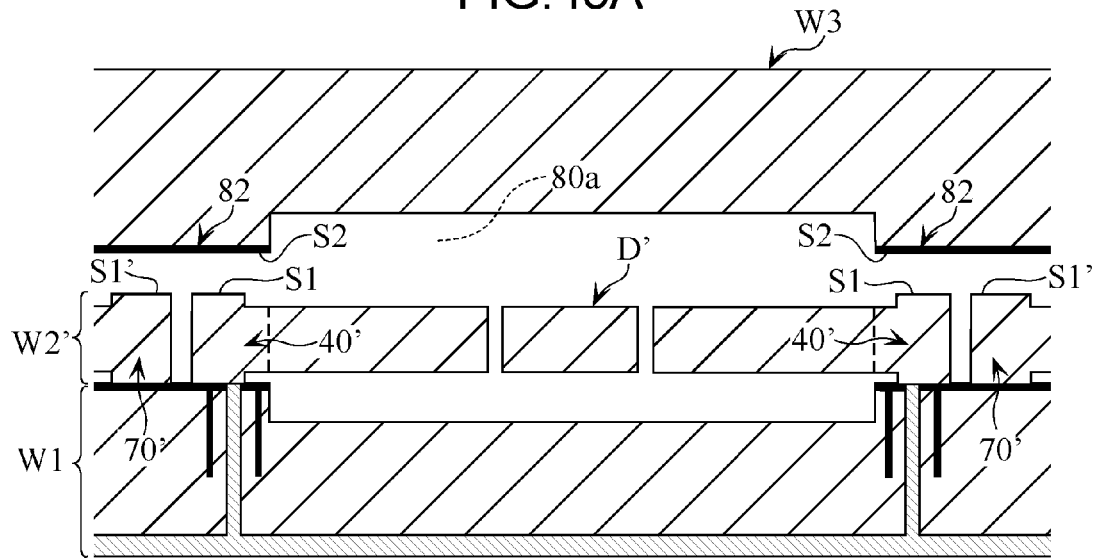
FIGS. 45A to 45C illustrate further processes subsequent to the process of FIG. 44C.
Figure 45B:
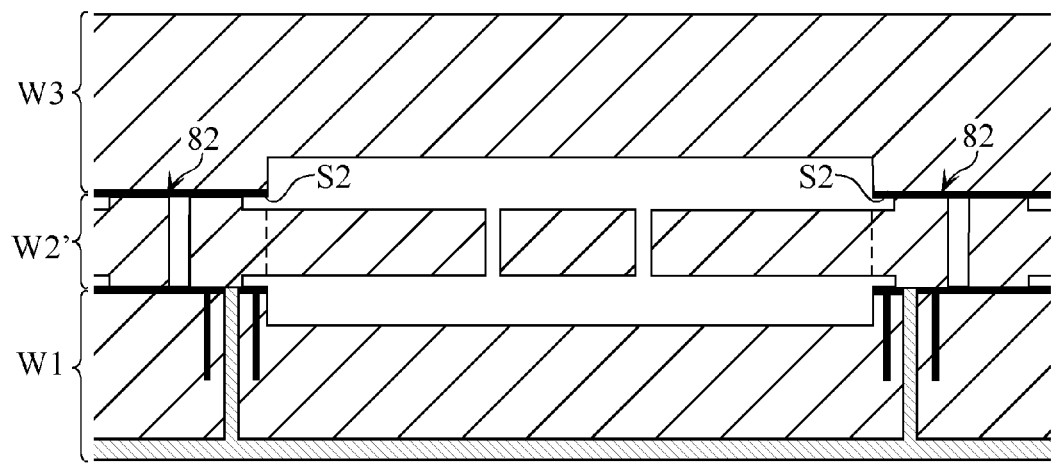
Figure 45C:
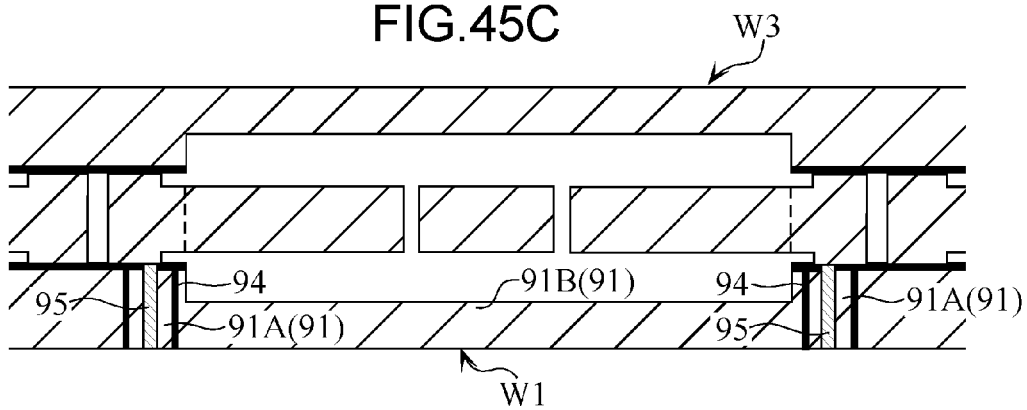
Figure 46A:
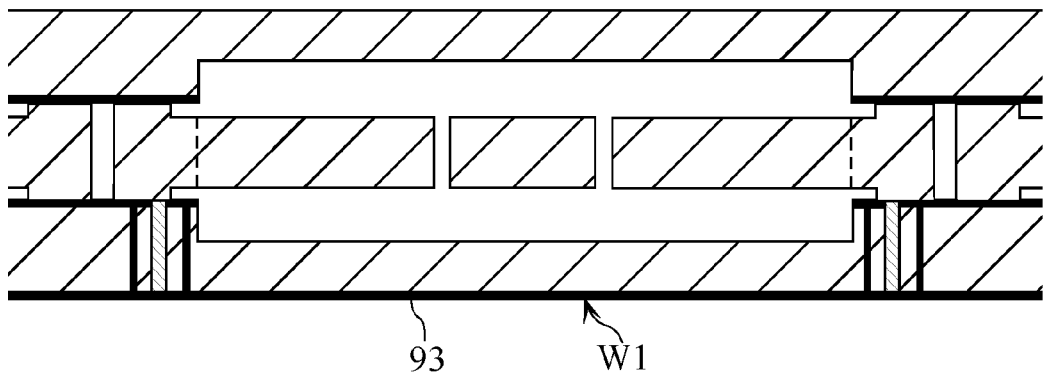
FIGS. 46A to 46C illustrate further processes subsequent to the process of FIG. 45C.
Figure 46B:
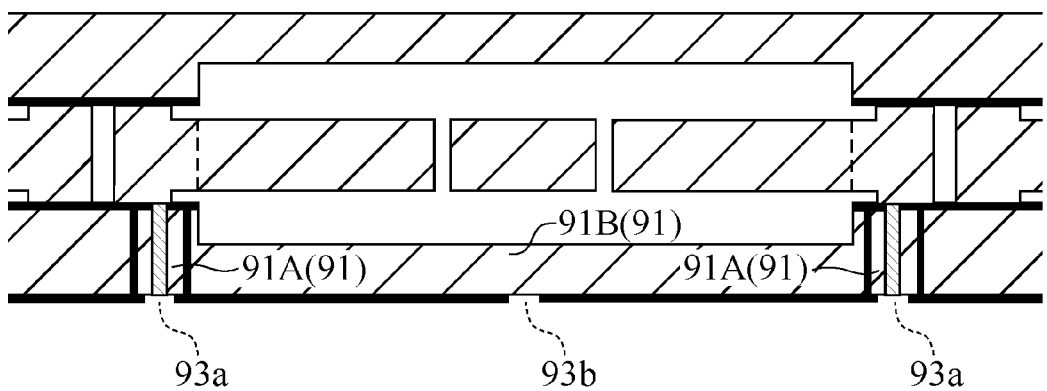
Figure 46C:
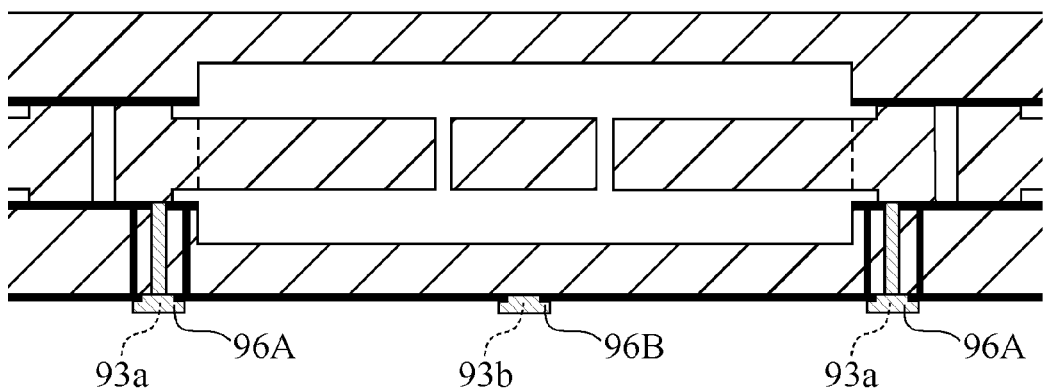
Figure 47A:
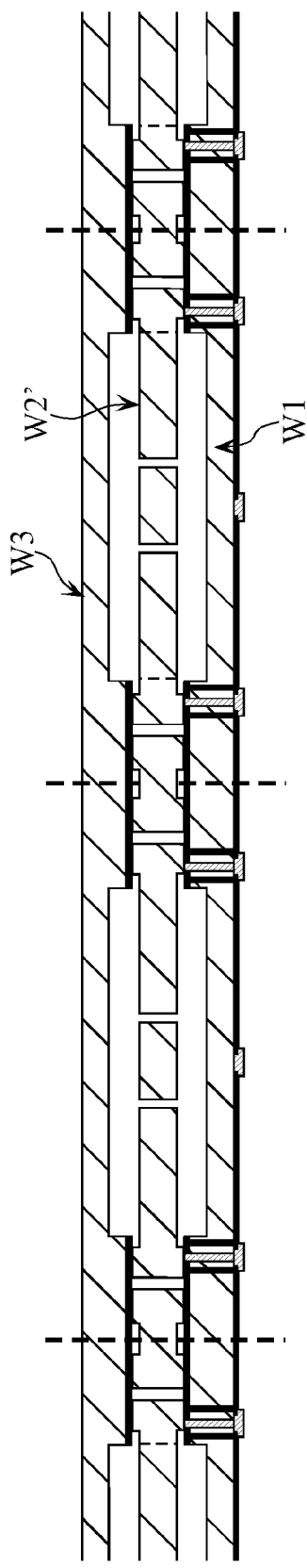
FIGS. 47A to 47B illustrate further processes subsequent to the process of FIG. 46C.
Figure 47B:
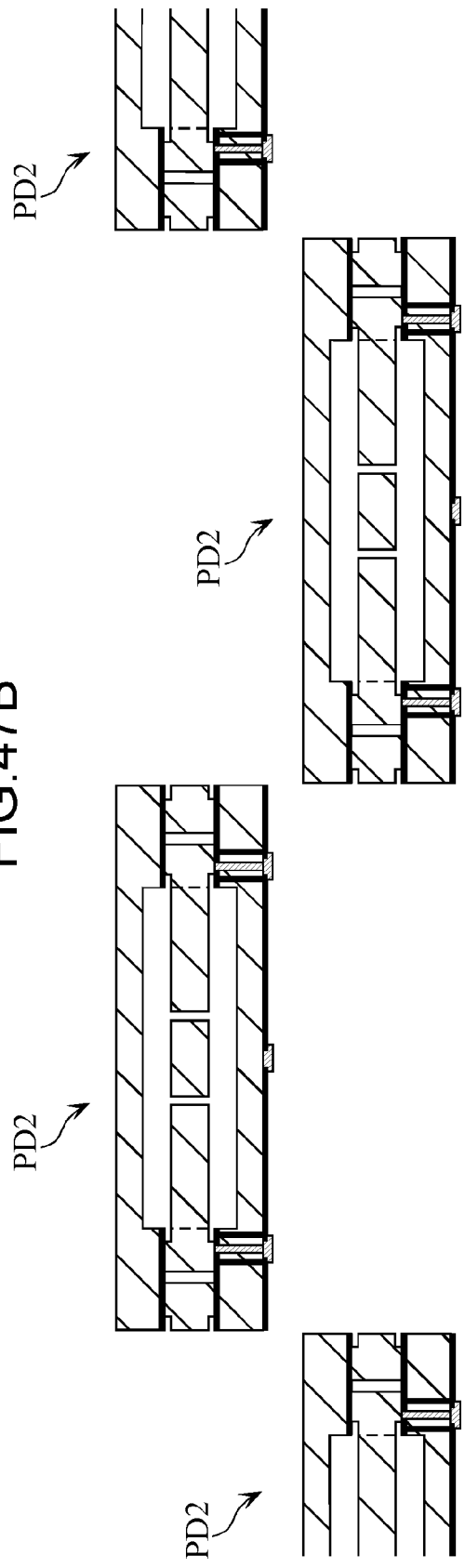

FIGS. 42A to 47B illustrate a method for producing the packaged device PD2 by the bulk micromachining technology. FIGS. 42A to 46C illustrate a change of a section corresponding to that of FIG. 31 included in a partition in which the single packaged device PD2 is formed. FIGS. 47A and 47B illustrate partial sections in the plural device forming partitions.

Figure 42A:
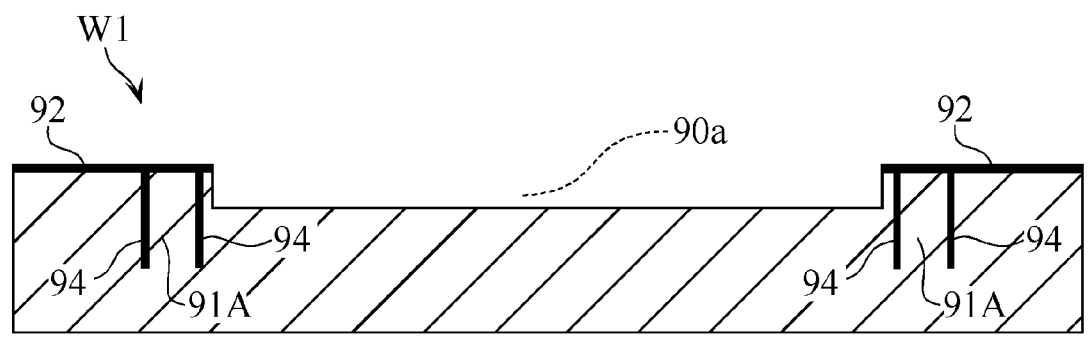
FIGS. 42A and 42B illustrate part of processes in a method for producing the packaged device of FIG. 29.
Figure 42B:
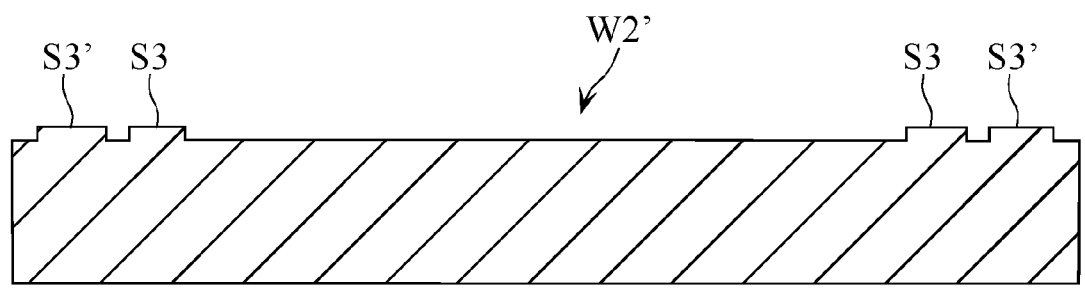

In the method, first the packaging wafer W1 of FIG. 42A is prepared, and the packaging wafer W2' of FIG. 42B is also prepared.

The packaging wafer W1 of FIG. 42A is prepared through the processes of FIGS. 23A to 23D in producing the packaged device PD1. Specifically, the packaging wafer W1 includes plural partitions in which the packaging units 90 are formed. Each packaging-unit forming partition includes the recess 90a, the insulating layer 92, and the insulating wall 94. As described above, the insulating layer 92 constitutes the bonding target surface S4 in the packaging wafer W1.

The device wafer W2' of FIG. 42B is a silicon wafer including plural device forming partitions in which the devices D' are formed, and is made of a silicon material to which the conductive property is imparted by doping an impurity. The p-type impurity such as B or the n-type impurity such as P and Sb can be adopted as the impurity. In one of the surfaces of the device wafer W2', the slice etching is performed to a predetermined region to form the bonding target surfaces S3 and S3'. Specifically, a resist pattern having a pattern shape corresponding to the bonding target surfaces S3 and S3' on the device substrate side is formed on the surface (upper surface of FIG. 25B) of the device wafer W2'. Then, using the resist pattern as a mask, the etching treatment is performed to the device wafer W2' to a predetermined depth by DRIE. For example, the predetermined depth ranges from 1 to 5 µm. Therefore, the bonding target surfaces S3 and S3' are formed in the device wafer W2'.

Figure 43A:
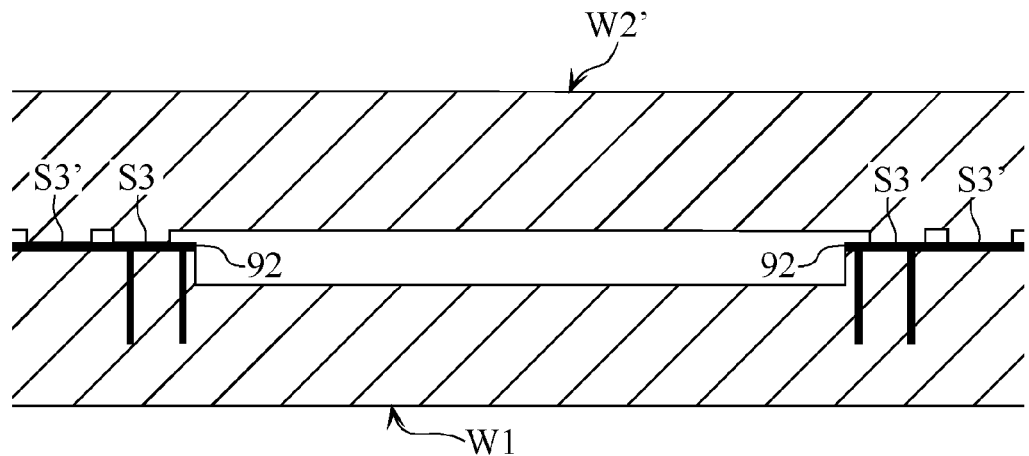
FIGS. 43A to 43C illustrate further processes subsequent to the process of FIG. 42B.

As illustrated in FIG. 43A, the packaging wafer W1 and the device wafer W2' are bonded by the room-temperature bonding method (first room-temperature bonding process). In the room-temperature bonding method, the high-temperature process can be avoided in the bonding, and therefore the problem caused by the high-temperature process can be avoided.

In performing the first room-temperature bonding process with the room-temperature bonding apparatus 300 of FIG. 4, for example, first the device wafer W2' is retained as the bonding target 305 by the stage 302. The packaging wafer W1 is also retained as the bonding target 306 by the stage 303. The vacuum pump is operated to evacuate the chamber 301 into a high vacuum state. The stages 302 and 303 are operated to cause the bonding target surfaces of the bonding targets 305 and 306 to face each other. Specifically, the bonding target surfaces S3 and S3' of the bonding target 305 (that is, device wafer W2') and the bonding target surface S4 of the bonding target 306 (that is, packaging wafer W1) face each other. Then the gun 304 irradiates the bonding target surfaces of the bonding targets 305 and 306 with the beam 304a to activate the bonding target surfaces. The irradiation intensity, irradiation time, and irradiation direction of the beam 304a are set such that the bonding target surfaces of the bonding targets 305 and 306 are efficiently activated. Then the stage 303 is operated to lower the bonding target 306, and the bonding target surfaces of the bonding targets 305 and 306 are brought into contact with each other. Therefore, the bonding targets 305 and 306 are strongly bonded. Specifically, the bonding target surfaces S3 and S3' of the bonding target 305 (that is, device wafer W2') and the bonding target surface S4 (insulating layer 92) of the bonding target 306 (that is, packaging wafer W1) are strongly bonded.

Figure 43B:
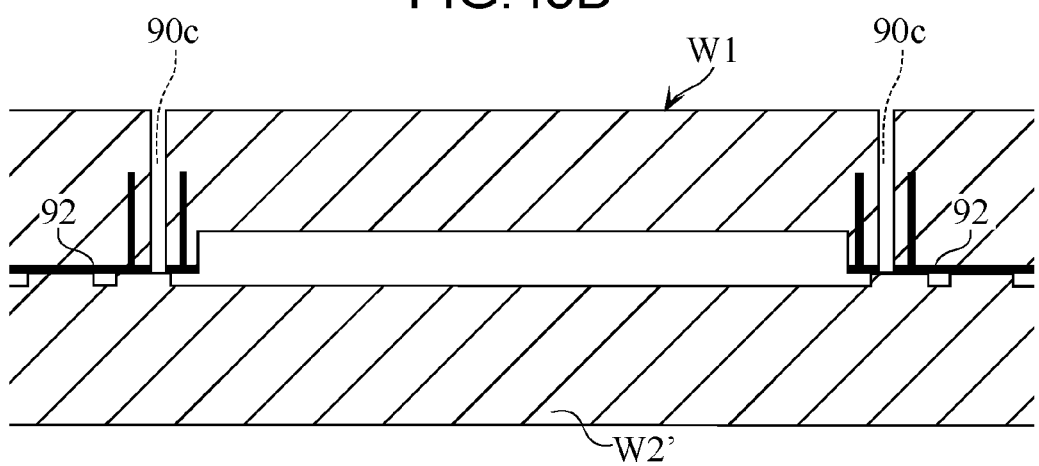

In producing the packaged device PD2, as illustrated in FIG. 43B, the through-hole 90c is made in the packaging wafer W1. The technique of making the through-hole 90c is similar to that of FIG. 24B.

Figure 43C:
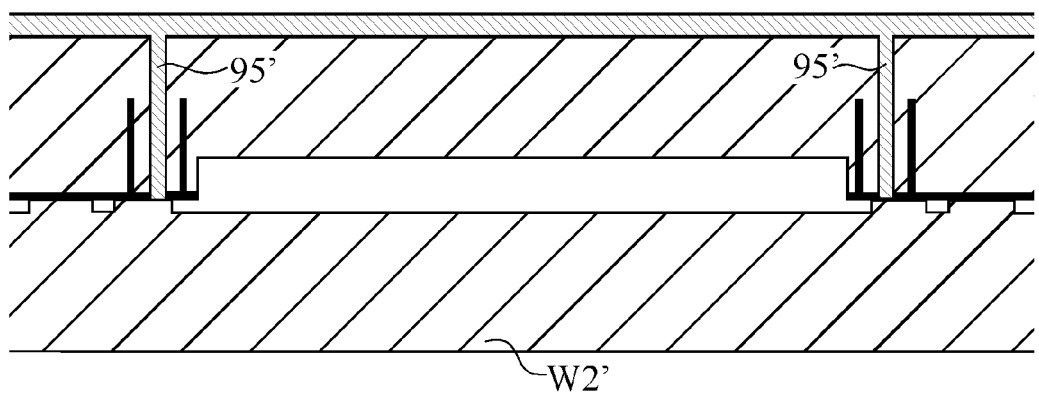

As illustrated in FIG. 43C, the through-hole 90c is filled with the conductive material 95' by the LP-CVD method or the MOCVD method. For example, the conductive material 95' is polysilicon.

Figure 44A:
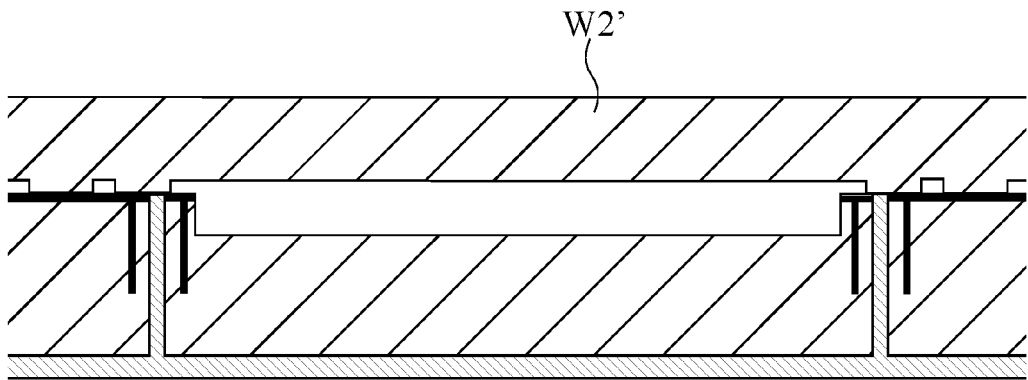
FIGS. 44A to 44C illustrate further processes subsequent to the process of FIG. 43C.

As illustrated in FIG. 44A, the whole of the device wafer W2' is thinned. The device wafer W2' can be thinned by performing the polishing treatment to the device wafer W2'. For example, Chemical Mechanical Polishing (CMP) can be adopted as the polishing technique. In the thinning process, for example, the thickness of the device wafer W2 is set to 20 to 100 µm.

Figure 44B:
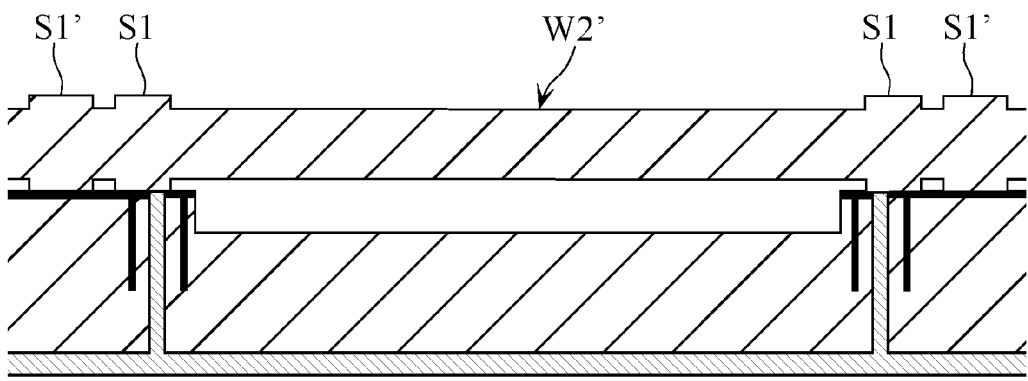

As illustrated in FIG. 44B, the slice etching is performed to a predetermined region of the device wafer W2'. Specifically, the resist pattern having the pattern shape corresponding to the bonding target surfaces S1 and S1' on the device substrate side is formed on the surface (upper surface of FIG. 44B) of the device wafer W2'. Then, using the resist pattern as the mask, the etching treatment is performed to the device wafer W2' to a predetermined depth by DRIE. For example, the predetermined depth ranges from 1 to 5 µm.

Figure 44C:
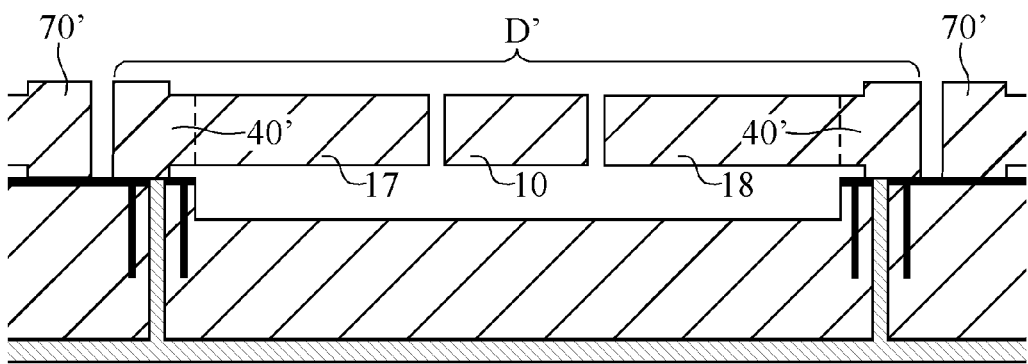

As illustrated in FIG. 44C, the units of the device D' and the external wall portion 70' are formed in the device wafer W2' that is hardly broken because of the bonding of the device wafer W2' to the packaging wafer W1. The units of the device D' include the vibration units 10 and 20, the drive electrodes 11 to 14 and 21 to 24, the monitor electrodes 15, 16, 25, and 26, the detection electrodes 17, 18, 27, and 28, the coupling beam unit 30, the anchor unit 40', and the connecting units 50 and 60. In the process, for example, the etching treatment is performed to the device wafer W2' by DRIE using a resist pattern having a pattern shape corresponding to the units of the device D' and the external wall portion 70' as a mask.

As illustrated in FIGS. 45A and 45B, the device wafer W2' and the packaging wafer W3 are bonded by the room-temperature bonding method (second room-temperature bonding process). The packaging wafer W3 includes plural partitions in order to form the packaging units 80, and each packaging-unit forming partition includes the recess 80a. The insulating layer 82 is provided on the surface of the packaging wafer W3. As described above, the insulating layer 82 constitutes the bonding target surface S2 of the packaging wafer W3. For example, the packaging wafer W3 has the thickness of 200 to 300 µm. In the process, the wafer-level packaging is achieved for the device D'.

In the room-temperature bonding method, the high-temperature process can be avoided in the bonding, and therefore the problem caused by the high-temperature process can be avoided. When the device wafer W2' is subjected to the high-temperature process after the device D' is formed, sometimes each unit of the device D' is deformed through the thermal expansion. In order to avoid such problems, the room-temperature bonding method is adopted as the technique of bonding the device wafer W2' and the packaging wafer W3 after the formation of the device D'.

In performing the second room-temperature bonding process with the room-temperature bonding apparatus 300 of FIG. 4, for example, first the laminated structure of the device wafer W2' and the packaging wafer W1 is retained as the bonding target 305 by the stage 302. The packaging wafer W3 is also retained as the bonding target 306 by the stage 303. The vacuum pump is operated to evacuate the chamber 301 into a high vacuum state. The stages 302 and 303 are operated to cause the bonding target surfaces of the bonding targets 305 and 306 to face each other. Specifically, the bonding target surfaces S1 and S1' of the bonding target 305 (or the device wafer W2' that is part of the bonding target 305) and the bonding target surface S2 of the bonding target 306 (that is, packaging wafer W3) face each other. Then the gun 304 irradiates the bonding target surfaces of the bonding targets 305 and 306 with the beam 304a to activate the bonding target surfaces. The irradiation intensity, irradiation time, and irradiation direction of the beam 304a are set such that the bonding target surfaces of the bonding targets 305 and 306 are efficiently activated. Then the stage 303 is operated to lower the bonding target 306, and the bonding target surfaces of the bonding targets 305 and 306 are brought into contact with each other. Therefore, the bonding targets 305 and 306 are strongly bonded. Specifically, the bonding target surfaces S1 and S1' of the bonding target 305 (or the device wafer W2' that is part of the bonding target 305) and the bonding target surface S2 (insulating layer 82) of the bonding target 306 (that is, packaging wafer W3) are strongly bonded.

In producing the packaged device PD2, as illustrated in FIG. 45C, the packaging wafer W1 is thinned and the packaging wafer W3 is also thinned (thinning process). For example, CMP or DRIE can be adopted as the thinning technique. Through thinning the packaging wafer W1, the wiring region 91A in the packaging wafer W1 is electrically separated from the non-wiring region 91B by the insulating wall 94, and the conductive plug 95 piercing through the wiring region 91A is formed. For example, the packaging wafer W1 has the thickness of 50 to 200 μm. For example, the packaging wafer W3 has the thickness of 50 to 150 μm.

As illustrated in FIG. 46A, the insulating layer 93 is formed. The material for the insulating layer 93 and the method for forming the insulating layer 93 are similar to those of FIG. 27A.

As illustrated in FIG. 46B, the openings 93a and 93b are formed in the insulating layer 93. The technique of forming the openings 93a and 93b is similar to that of FIG. 27B. Through the process, the wiring region 91A is exposed in the opening 93a, and the non-wiring region 91B is exposed in the opening 93b.

As illustrated in FIG. 46C, the electrode pads 96A and 96B are formed. The technique of forming the electrode pads 96A and 96B is similar to that of FIG. 27C.

As illustrated in FIGS. 47A and 47B, the laminated structure including the device wafer W2' and the packaging wafers W1 and W3 are individually cut. In this manner, the packaged device PD2 can be produced.

In the method, because the wafer-level packaging is achieved, the deterioration of the operating performance of the movable unit, caused by the adhesion of the dust to each unit of the device D' that is the micro movable device or the damage of each unit of the device D', can be prevented.

In the method, through the first room-temperature bonding process of FIGS. 43A and 4, the beam irradiation is performed in the high-vacuum chamber 301 while the bonding targets 305 and 306 are retained by the stages 302 and 303 and disposed to face each other. Due to the beam irradiation, sputter etching is also performed to the chamber 301 and the metallic structures of the stages 302 and 303, and the metallic structures emit metal (such as Fe, Al, and Cr). The minute amount of metal adheres to or is incorporated into the surfaces of the bonding targets 305 and 306. However, the amount of adhered and incorporated metal is uneven over the whole surfaces of the bonding targets 305 and 306. Specifically, while the relatively small amount of adhered and incorporated metal is even in the surfaces (including bonding target surface) facing each other in the bonding targets 305 and 306, many points having relatively large amount of adhered and incorporated metal exist in other surfaces of the bonding targets 305 and 306.

In the packaged device PD2, the bonding target surface S3 of the anchor unit 40' in the device substrate and the bonding target surface S3' of the external wall portion 70' and the bonding target surface S4 in the insulating layer 92 of the packaging unit 90 are bonded by the first room-temperature bonding method. Therefore, as described above with reference to FIG. 41B, the metal concentration in the part or whole of the peripheral surface 92b of the insulating layer 92 is higher than the metal concentration in the end surface 92a on the device substrate side of the insulating layer 92. That is, the insulating property in the part or whole of the peripheral surface 92b of the insulating layer 92 of the packaging unit 90 is lowered through the bonding process by the room-temperature bonding method.

However, in the bonding target surfaces S3 and S4 of the packaged device PD2, the outline of the bonding target surface S3 is retreated inward from the outline of the bonding target surface S4. That is, the bonding target surface S3 of the device D' or anchor unit 40' in the device substrate does not come into contact with the peripheral surface 92b of the insulating layer 92, which constitutes the bonding target surface S4 of the packaging unit 90. Therefore, in the packaged device PD2, when the potential difference is generated between the device D' and the non-wiring region 91B in the packaging unit 90, the leak current passed through the point where the insulating property of the peripheral surface 92b of the insulating layer 92 is lowered is hardly generated between the device D' and the non-wiring region 91B. Accordingly, the packaged device PD2 is suitable for the electric separation between the device D' and the non-wiring region 91B of the packaging unit 90. The electric separation between the device D' and the non-wiring region 91B is necessary to avoid the electric connection of the units of the device D' to one another through the non-wiring region 91B. As described above, the length by which the outline of the bonding target surface S3 is retreated inward from the outline of the bonding target surface S4 is 10 μm or more, and the insulating layer 92 has the thickness of 50 nm or more. These configurations contribute to the electric separation between the device D' and the non-wiring region 91B of the packaging unit 90.

In the bonding target surfaces S3' and S4 of the packaged device PD2, the outline of the bonding target surface S3' is retreated inward from the outline of the bonding target surface S4. That is, the bonding target surface S3' of the external wall portion 70' in the device substrate does not come into contact with the peripheral surface 92b of the insulating layer 92, which constitutes the bonding target surface S4 of the packaging unit 90. Therefore, in the packaged device PD2, when the potential difference is generated between the external wall portion 70' and the non-wiring region 91B of the packaging unit 90, the leak current passed through the point where the insulating property of the peripheral surface 92b of the insulating layer 92 is lowered is hardly generated between the external wall portion 70' and the non-wiring region 91B. Accordingly, the packaged device PD2 is suitable for the electric separation between the external wall portion 70' and the non-wiring region 91B of the packaging unit 90. The electric separation between the external wall portion 70' and the non-wiring region 91B is necessary to avoid the electric connection of the units of the device D' to one another through the non-wiring region 91B and the external wall portion 70'. As described above, preferably the length by which the outline of the bonding target surface S3' is retreated inward from the outline of the bonding target surface S4 is 10 μm or more, and the insulating layer 92 has the thickness of 50 nm or more. These configurations contribute to the electric separation between the external wall portion 70' and the non-wiring region 91B of the packaging unit 90.

In the second room-temperature bonding process of FIGS. 45A, 45B, and 4 of the method, the beam irradiation is performed in the high-vacuum chamber 301 while the bonding targets 305 and 306 are retained by the stages 302 and 303 and disposed to face each other. Due to the beam irradiation, sputter etching is also performed to the chamber 301 and the metallic structures of the stages 302 and 303, and the metallic structures emit metal (such as Fe, Al, and Cr). The minute amount of metal adheres to or is incorporated into the surfaces of the bonding targets 305 and 306. However, the amount of adhered and incorporated metal is uneven over the whole surfaces of the bonding targets 305 and 306. Specifically, while the relatively small amount of adhered and incorporated metal is even in the surfaces (including bonding target surface) facing each other in the bonding targets 305 and 306, many points having relatively large amount of adhered and incorporated metal exist in other surfaces of the bonding targets 305 and 306.

In the packaged device PD2, the bonding target surface S1 of the anchor unit 40' in the device substrate and the bonding target surface S1' of the external wall portion 70' and the bonding target surface S2 in the insulating layer 82 of the packaging unit 80 are bonded by the second room-temperature bonding method. Therefore, as described above with reference to FIG. 41A, the metal concentration in the part or whole of the peripheral surface 82b of the insulating layer 82 is higher than the metal concentration in the end surface 82a on the device substrate side of the insulating layer 82. That is, the insulating property in the part or whole of the peripheral surface 82b of the insulating layer 82 of the packaging unit 80 is lowered through the bonding process by the room-temperature bonding method.

However, in the bonding target surface S1 and S2 of the packaged device PD2, the outline of the bonding target surface S1 is retreated inward from the outline of the bonding target surface S2. That is, the bonding target surface S1 of the device D' or anchor unit 40' in the device substrate does not come into contact with the peripheral surface 82b of the insulating layer 82, which constitutes the bonding target surface S2 of the packaging unit 80. Therefore, in the packaged device PD2, when the potential difference is generated between the device D' and the base material 81 of the packaging unit 80, the leak current passed through the point where the insulating property of the peripheral surface 82b of the insulating layer 82 is lowered is hardly generated between the device D' and the base material 81. Accordingly, the packaged device PD2 is suitable for the electric separation between the device D' and the base material 81 of the packaging unit 80. The electric separation between the device D' and the base material 81 is necessary to avoid the electric connection of the units of the device D' to one another through the base material 81 of the packaging unit 80. As described above, preferably the length by which the outline of the bonding target surface S1 is retreated inward from the outline of the bonding target surface S2 is 10 µm or more, and the insulating layer 82 has the thickness of 50 nm or more. These configurations contribute to the electric separation between the device D' and the base material 81 of the packaging unit 80.

In the bonding target surfaces S1' and S2 of the packaged device PD2, the outline of the bonding target surface S1' is retreated inward from the outline of the bonding target surface S2. That is, the bonding target surface S1' of the external wall portion 70' in the device substrate does not come into contact with the peripheral surface 82b of the insulating layer 82, which constitutes the bonding target surface S2 of the packaging unit 80. Therefore, in the packaged device PD2, when the potential difference is generated between the external wall portion 70' and the base material 81 of the packaging unit 80, the leak current passed through the point where the insulating property of the peripheral surface 82b of the insulating layer 82 is lowered is hardly generated between the external wall portion 70' and the base material 81. Accordingly, the packaged device PD2 is suitable for the electric separation between the external wall portion 70' and the base material 81 of the packaging unit 80. The electric separation between the external wall portion 70' and the base material 81 is necessary to avoid the electric connection of the units of the device D' to one another through the base material 81 and the external wall portion 70'. As described above, preferably the length by which the outline of the bonding target surface S1' is retreated inward from the outline of the bonding target surface S2 is 10 µm or more, and the insulating layer 82 has the thickness of 50 nm or more. These configurations contribute to the electric separation between the external wall portion 70' and the base material 81 of the packaging unit 80.

Additionally, the method is suitable for the low-profile package, suitable to ensure the strength and the ease of handling of the packaging wafers W1 and W3 before the packaging wafers W1 and W3 are bonded to the device wafer W2', and suitable to suppress the number of processes. The reason is similar to the reason why the method of FIGS. 23A to 28B is suitable for the low-profile package, suitable to ensure the strength and the ease of handling of the packaging wafers W1 and W3, and suitable to suppress the number of processes.

The packaged devices PD1 and PD2 of the first and second embodiments include the angular velocity sensor that is the sealed device. Alternatively, the packaged device may include another kind of device that is the sealed device. An acceleration sensor and a micromirror element are cited as an example of another kind of device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A packaged device comprising:
   a device substrate including a first surface and a device formed in the device substrate; and
   a packaging unit including an insulating layer facing the device substrate, the insulating layer including a second surface bonded to the first surface,
   wherein a metal concentration of at least part of a peripheral surface in the insulating layer is higher than a metal concentration of an end surface of the insulating layer on a side facing the device substrate, and an outline of the first surface is retreated inward from an outline of the second surface,
   wherein the device substrate includes a third surface facing a portion of the second surface, the portion not being in contact with the first surface and being located at an inward-retreated portion of the first surface from the outline of the second surface.

2. The packaged device according to claim 1, wherein a length by which the outline of the first surface is retreated inward from the outline of the second surface is 10 µm or more.

3. The packaged device according to claim 1, wherein the device substrate includes a partial structure including a fourth surface bonded to the second surface, and
   an outline of the fourth surface is retreated inward from the outline of the second surface.

4. The packaged device according to claim 3, wherein a length by which the outline of the third surface is retreated inward from the outline of the second surface is 10 µm or more.

5. The packaged device according to claim 1, wherein the insulating layer has a thickness of 50 nm or more.

6. A method for fabricating a packaged device comprising:
   preparing a device substrate including a first surface and a device formed in the device substrate;
   preparing a packaging unit including an insulating layer with a second surface to be bonded to the first surface; and bonding the first surface and the second surface by a room-temperature bonding method, wherein the first surface and the second surface are bonded to each other such that an outline of the first surface is retreated inward from an outline of the second surface, wherein the device substrate includes a third surface facing a portion of the second surface, the portion not being in contact with the first surface and being located at an inward-retreated portion of the first surface from the outline of the second surface.

7. The method according to claim 6, wherein a length by which the outline of the first surface is retreated inward from the outline of the second surface is 10 µm or more.

8. The method according to claim 6, wherein the insulating layer has a thickness of 50 nm or more.

* * * * *